US011804669B2

(12) United States Patent
Komoto et al.

(10) Patent No.: US 11,804,669 B2
(45) Date of Patent: Oct. 31, 2023

(54) ELECTRONIC EQUIPMENT

(71) Applicant: JAPAN AVIATION ELECTRONICS INDUSTRY, LIMITED, Tokyo (JP)

(72) Inventors: Tetsuya Komoto, Tokyo (JP); Akira Kimura, Tokyo (JP); Keisuke Nakamura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 51 days.

(21) Appl. No.: 17/700,619

(22) Filed: Mar. 22, 2022

(65) Prior Publication Data
US 2022/0352671 A1 Nov. 3, 2022

(30) Foreign Application Priority Data
Apr. 28, 2021 (JP) ................................. 2021-075537

(51) Int. Cl.
 *H01R 13/52* (2006.01)
 *H01R 13/74* (2006.01)
(52) U.S. Cl.
 CPC ......... *H01R 13/5219* (2013.01); *H01R 13/74* (2013.01)
(58) Field of Classification Search
 CPC ............ H01R 13/5219; H01R 13/5202; H01R 13/52; H01R 13/73; H01R 13/74
 See application file for complete search history.

(56) References Cited

U.S. PATENT DOCUMENTS

| 4,944,688 A | * | 7/1990 | Lundergan | ......... H01R 13/5221 |
| | | | | 439/752 |
| 5,336,101 A | * | 8/1994 | Kasugai | ............... H01R 13/639 |
| | | | | 439/272 |
| 5,492,487 A | * | 2/1996 | Cairns | ................ H01R 13/5219 |
| | | | | 439/271 |

(Continued)

FOREIGN PATENT DOCUMENTS

| JP | S5986754 A | 5/1984 |
| JP | S6218661 U | 7/1987 |

(Continued)

OTHER PUBLICATIONS

Extended European Search Report (EESR) dated Sep. 14, 2022, issued in counterpart European Application No. 22163795.2.

*Primary Examiner* — Harshad C Patel
(74) *Attorney, Agent, or Firm* — Holtz, Holtz & Volek PC

(57) ABSTRACT

An electronic equipment comprises a case and a connector which is attached to the case. The connector comprises a housing and a waterproofing member. The waterproofing member is sandwiched by a mating connector and a side portion of the housing in a second direction when the connector is mated with the mating connector. The waterproofing member has at least one first contact portion, at least one second contact portion, at least one third contact portion and at least one fourth contact portion. The third contact portion is pressed against the side portion in the second direction by elasticity of the waterproofing member upon the mating of the connector with the mating connector. The fourth contact portion is pressed against and in contact with the mating connector in the second direction by the elasticity of the waterproofing member upon the mating of the connector with the mating connector.

13 Claims, 10 Drawing Sheets

(56) References Cited

U.S. PATENT DOCUMENTS

| | | | | |
|---|---|---|---|---|
| 6,045,383 | A * | 4/2000 | Fujiwara | H01R 13/5219 439/271 |
| 6,244,886 | B1 * | 6/2001 | Strang | H01R 13/5202 439/271 |
| 6,368,132 | B1 * | 4/2002 | Okayasu | H01R 13/533 439/275 |
| 6,443,764 | B2 * | 9/2002 | Makita | H01R 13/5219 439/271 |
| 7,611,369 | B2 * | 11/2009 | Matsunaga | H01R 13/631 439/271 |
| 8,187,042 | B2 * | 5/2012 | Kimura | H01R 13/4365 439/271 |
| 8,215,987 | B2 * | 7/2012 | Yoshioka | H01R 13/4362 439/587 |
| 9,337,571 | B2 * | 5/2016 | Furuya | H01R 13/5219 |
| 10,367,292 | B2 * | 7/2019 | Furuya | H01R 13/5202 |
| 2020/0259290 | A1 | 8/2020 | Hashii | |

FOREIGN PATENT DOCUMENTS

| | | |
|---|---|---|
| JP | 2002195411 A | 7/2002 |
| JP | 2008218633 A | 9/2008 |
| JP | 2014040847 A | 3/2014 |
| JP | 2014112484 A | 6/2014 |
| WO | 2010027009 A1 | 3/2010 |

\* cited by examiner

ELECTRONIC EQUIPMENT

CROSS REFERENCE TO RELATED APPLICATIONS

This application is based on and claims priority under 35 U.S.C. § 119 to Japanese Patent Application No. JP2021-075537 filed Apr. 28, 2021, the contents of which are incorporated herein in their entirety by reference.

BACKGROUND OF THE INVENTION

This invention relates to an electronic equipment comprising a connector having a waterproofing member.

As shown in FIG. 18, JPA2014-112484 (Patent Document 1) discloses an electronic equipment 900 of this type. The electronic equipment 900 comprises a housing 910 and a housing-side connection portion 920, or a connector 920. The connector 920 is attached to a wall surface 912 of the housing 910. The connector 920 is mateable along a Z-direction with a cable-side connection portion, or a mating connector, which is not shown in the figure. The connector 920 comprises a housing-side housing portion 922, or a housing 922, a first waterproofing rubber 924, a second waterproofing rubber 925 and a gap waterproofing rubber 926. The electronic equipment 900 forms a waterproof seal between the housing 922 and the wall surface 912 by using the first waterproofing rubber 924 and the second waterproofing rubber 925 of the connector 920. The electronic equipment 900 and the mating connector form a waterproof seal between the housing 922 of the connector 920 and a cable-side housing, which is not shown in the figure, of the mating connector by using the gap waterproofing rubber 926 when the connector 920 and the mating connector are mated with each other.

There is a requirement to reduce the number of waterproofing components of a connector of an electronic equipment such as the electronic equipment 900 of Patent Document 1.

SUMMARY OF THE INVENTION

It is therefore an object of the present invention to provide an electronic equipment comprising a connector which has a reduced number of waterproofing components.

One aspect of the present invention provides an electronic equipment comprising a case and a connector which is attached to the case. The case has a main portion. The main portion has a top surface and a back surface in a first direction. The main portion has an opening. The opening pierces the main portion in the first direction. The connector is mateable along the first direction with a mating connector which is inserted through the opening. The connector comprises a housing and a waterproofing member. The housing has a bottom portion and a side portion. The bottom portion is positioned away from the back surface of the main portion in the first direction. The side portion extends from the bottom portion toward the back surface of the main portion in the first direction. The waterproofing member has an elastic property and is attached to the housing. The waterproofing member is sandwiched by the bottom portion and the back surface of the main portion in the first direction. The waterproofing member is sandwiched by the mating connector and the side portion in a second direction perpendicular to the first direction when the connector is mated with the mating connector. The waterproofing member has at least one first contact portion, at least one second contact portion, at least one third contact portion and at least one fourth contact portion. The first contact portion is pressed against and in contact with the bottom portion in the first direction by the elasticity of the waterproofing member. The second contact portion is pressed against and in contact with the back surface of the main portion in the first direction by the elasticity of the waterproofing member. The third contact portion is in contact with the side portion in the second direction. The third contact portion is pressed against the side portion in the second direction by the elasticity of the waterproofing member upon the mating of the connector with the mating connector. The fourth contact portion protrudes inward in the second direction beyond the opening. The fourth contact portion is pressed against and in contact with the mating connector in the second direction by the elasticity of the waterproofing member upon the mating of the connector with the mating connector.

The electronic equipment of the present invention is configured as follows: the waterproofing member has the at least one first contact portion, the at least one second contact portion, the at least one third contact portion and the at least one fourth contact portion; the first contact portion is pressed against and in contact with the bottom portion of the housing of the connector in the first direction by the elasticity of the waterproofing member; the second contact portion is pressed against and in contact with the back surface of the main portion of the case in the first direction by the elasticity of the waterproofing member; the third contact portion is in contact with the side portion of the housing of the connector in the second direction; the third contact portion is pressed against the side portion of the housing of the connector in the second direction by the elasticity of the waterproofing member upon the mating of the connector with the mating connector; and the fourth contact portion is pressed against and in contact with the mating connector in the second direction by the elasticity of the waterproofing member upon the mating of the connector with the mating connector. Specifically, the electronic equipment of the present invention is configured so that the single waterproofing member provides a waterproof seal between the connector and the case and provides a waterproof seal between the connector and the mating connector. Thus, the electronic equipment of the present invention comprises the connector which has a reduced number of waterproofing components.

An appreciation of the objectives of the present invention and a more complete understanding of its structure may be had by studying the following description of the preferred embodiment and by referring to the accompanying drawings.

Figure 1:
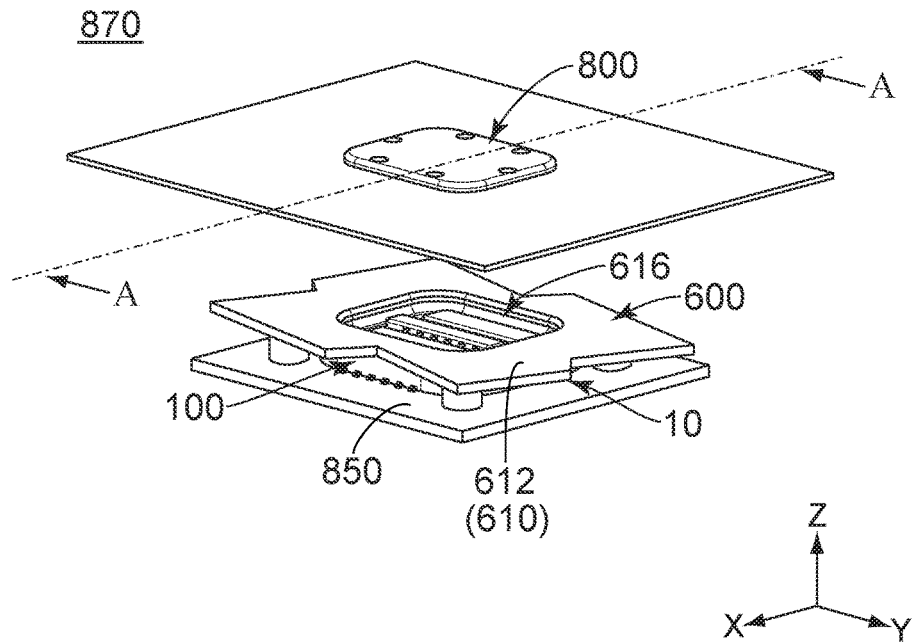
FIG. 1 is a perspective view showing an assembly according to a first embodiment of the present invention. In the figure, a mating connector and a connector of an electronic equipment are not mated with each other.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

First Embodiment

As shown in FIG. 1, an assembly 870 according to a first embodiment of the present invention comprises an electronic equipment 10 and a mating connector 800.

Figure 2:
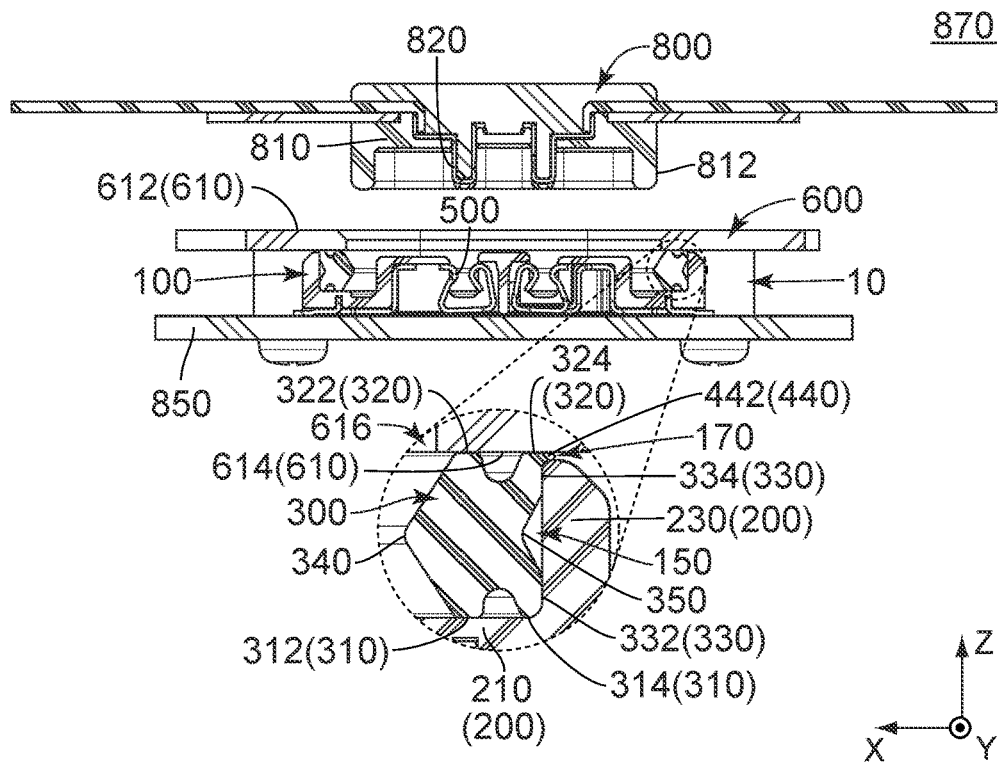
FIG. 2 is a cross-sectional view showing the assembly of FIG. 1, taken along line A-A. In the figure, a part of the electronic equipment is enlarged and illustrated.
Figure 3:
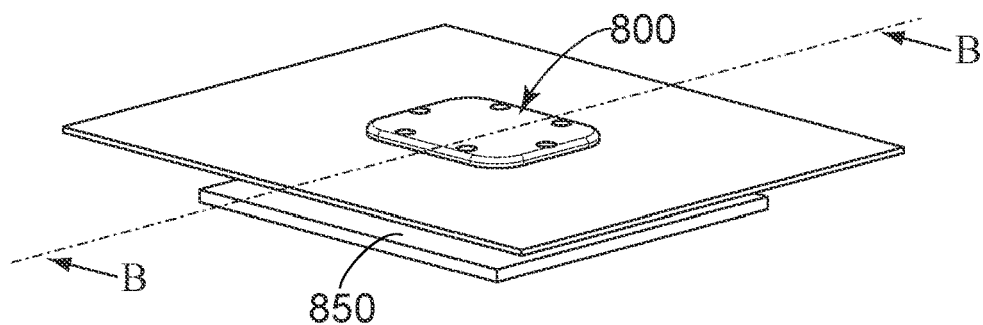
FIG. 3 is another perspective view showing the assembly of FIG. 1. In the figure, the connector and the mating connector are mated with each other.

As shown in FIG. 2, the mating connector 800 of the present embodiment comprises a mating housing 810 and a plurality of mating terminals 820. The mating housing 810 has an abutment portion 812 which faces outward in a second direction perpendicular to a first direction. In the present embodiment, the first direction is a Z-direction. In addition, the first direction is also referred to as an up-down direction. Specifically, it is assumed that upward is a positive Z-direction while downward is a negative Z-direction. The mating terminals 820 are held by the mating housing 810.

Figure 6:
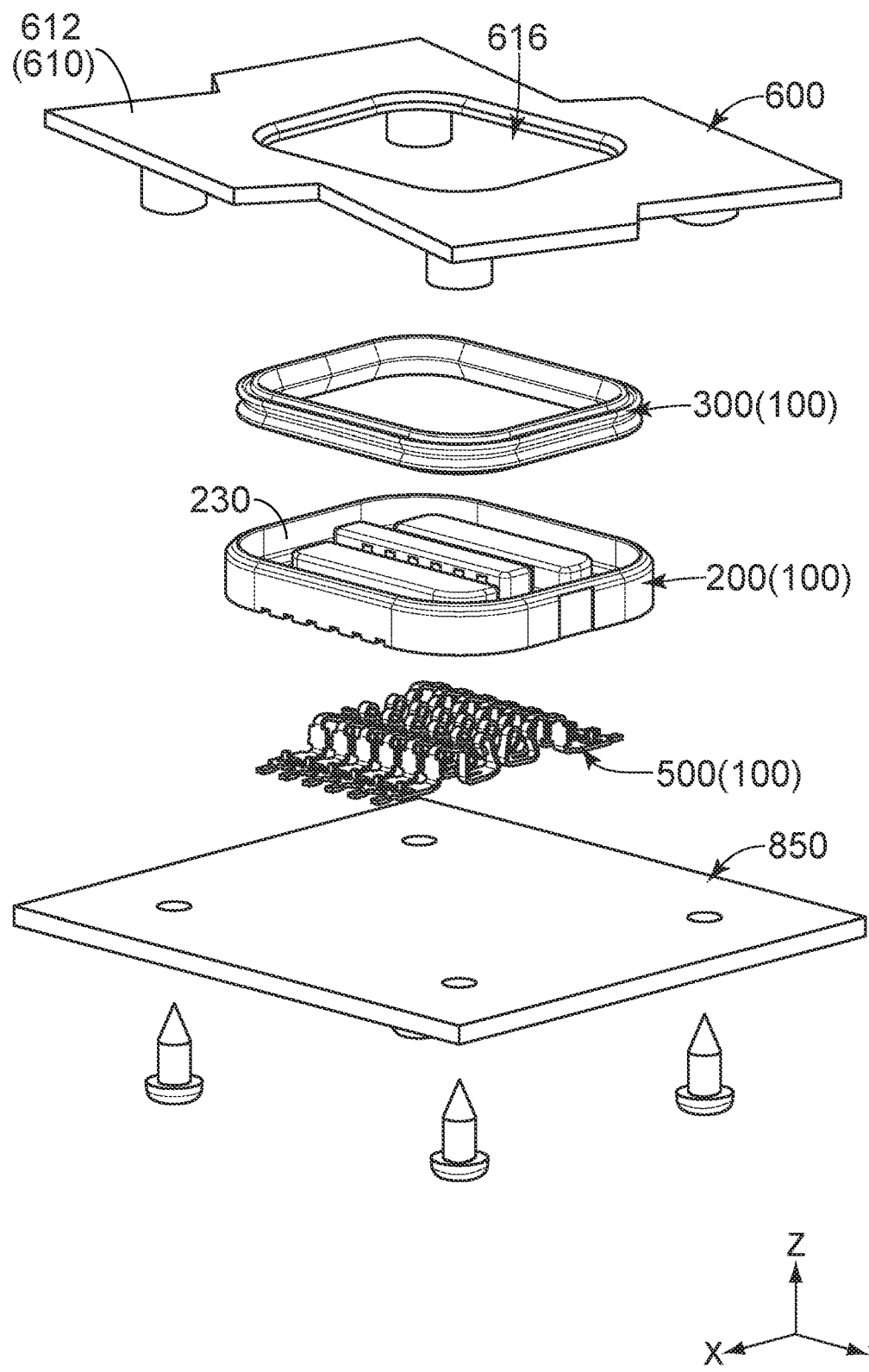
FIG. 6 is an exploded, perspective view showing the electronic equipment of FIG. 5.

As shown in FIG. 6, the electronic equipment 10 of the present embodiment comprises a case 600 and a connector 100.

Referring to FIG. 6, the case 600 of the present embodiment is made of resin. The case 600 has a main portion 610.

Figure 5:
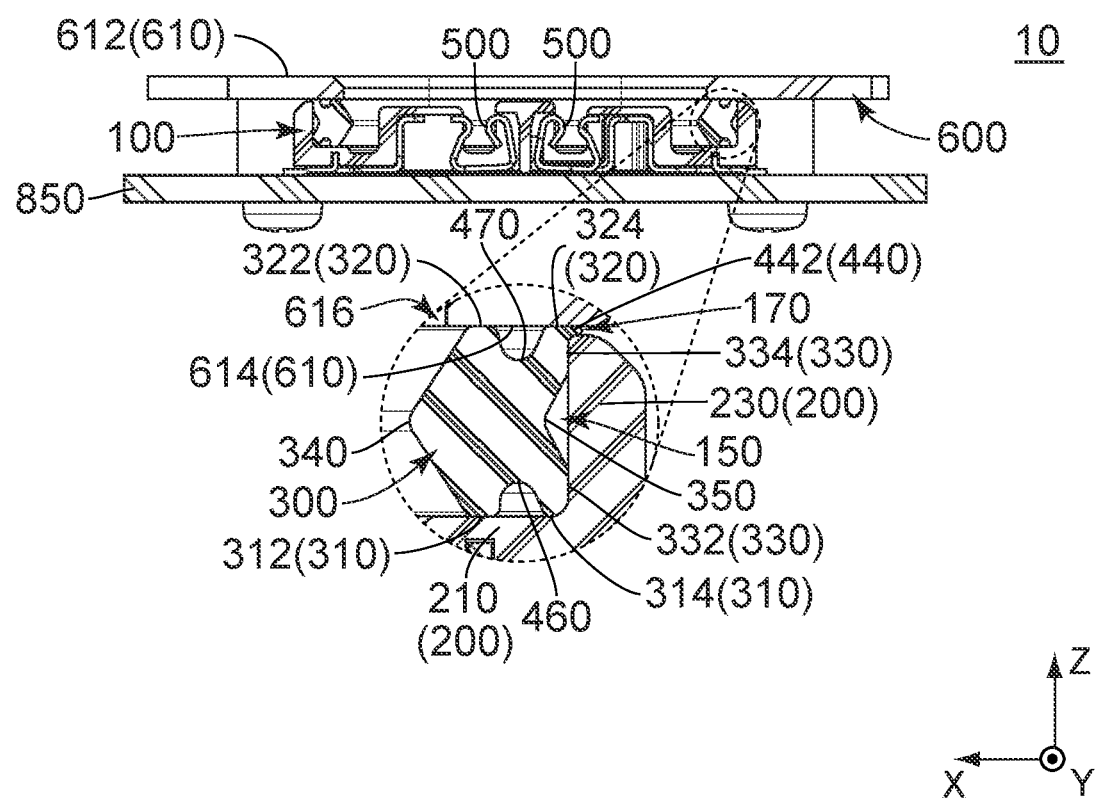
FIG. 5 is a cross-sectional view showing the electronic equipment which is included in the assembly of FIG. 2. In the figure, a part of the electronic equipment is enlarged and illustrated.

As shown in FIG. 5, the main portion 610 of the present embodiment has a flat-plate shape perpendicular to the first direction. The main portion 610 has a top surface 612 and a back surface 614 in the first direction. The top surface 612 faces outward in the first direction. Specifically, the top surface 612 faces upward in the up-down direction. The back surface 614 faces inward in the first direction. Specifically, the back surface 614 faces downward in the up-down direction. The main portion 610 is provided with an opening 616. The opening 616 pierces the main portion 610 in the first direction.

As shown in FIG. 5, the connector 100 of the present embodiment is attached to the case 600. The connector 100 is configured to be mounted on a circuit board 850. As understood from FIGS. 2 and 4, the connector 100 is mateable along the first direction with the mating connector 800 which is inserted through the opening 616. More specifically, the connector 100 is mateable along the up-down direction with the mating connector 800 which is inserted through the opening 616 from above.

As shown in FIG. 6, the connector 100 comprises a housing 200, a plurality of terminals 500 and a waterproofing member 300.

Referring to FIG. 6, the housing 200 of the present embodiment is made of insulator. As shown in FIG. 5, the housing 200 has a bottom portion 210 and a side portion 230.

As shown in FIG. 5, the bottom portion 210 of the present embodiment has a flat-plate shape perpendicular to the first direction. The bottom portion 210 is positioned around an end portion of the connector 100 in the second direction perpendicular to the first direction. The bottom portion 210 is positioned away from the back surface 614 of the main portion 610 in the first direction.

Referring to FIG. 6, the side portion 230 of the present embodiment has a substantially rectangular shape when viewed along the first direction. As shown in FIG. 5, the side portion 230 extends from the bottom portion 210 toward the back surface 614 of the main portion 610 in the first direction. Specifically, the side portion 230 extends upward in the up-down direction from the bottom portion 210. The electronic equipment 10 is formed with a gap 170 between the case 600 and the side portion 230 of the housing 200. In other words, the back surface 614 of the main portion 610 and the side portion 230 of the housing 200 are spaced away from each other in the first direction.

As shown in FIG. 5, the side portion 230 extends upward from an outer end of the bottom portion 210 in the second direction. A part consisting of the bottom portion 210 and the side portion 230 has an L-shaped cross-section in a plane which includes the first direction. A part consisting of the case 600, and the bottom portion 210 and the side portion 230 of the housing 200 has a substantially angular C-shaped cross-section in the plane which includes the first direction. Specifically, the substantially angular C-shaped cross-section opens inward in the second direction perpendicular to the first direction. In other words, the part consisting of the case 600, and the bottom portion 210 and the side portion 230 of the housing 200 forms a groove-like recess which accommodates the waterproofing member 300.

Figure 4:
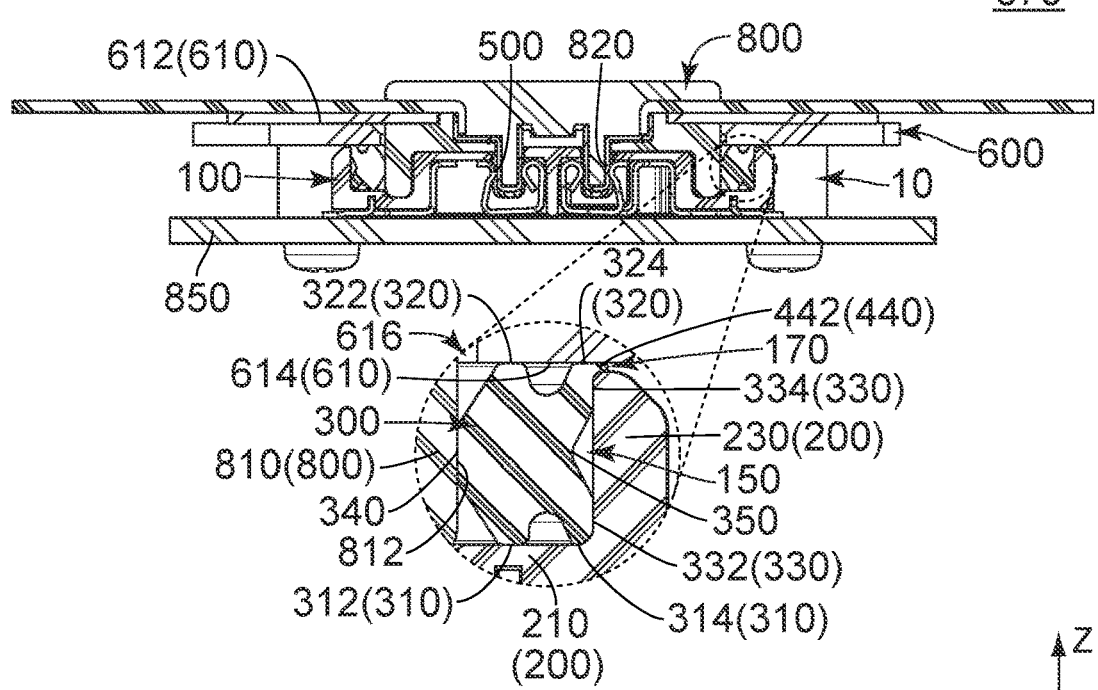
FIG. 4 is a cross-sectional view showing the assembly of FIG. 3, taken along line B-B. In the figure, parts of the electronic equipment and the mating connector are enlarged and illustrated.

Referring to FIG. 5, each of the terminals 500 of the present embodiment is made of metal. The terminals 500 are held by the housing 200. As shown in FIG. 4, the terminals 500 are connected with the mating terminals 820, respectively, when the connector 100 and the mating connector 800 are mated with each other.

Referring to FIG. 6, the waterproofing member 300 of the present embodiment has a rectangular ring shape with rounded corners when viewed along the first direction. The waterproofing member 300 has an elastic property. The waterproofing member 300 is made of seamless rubber. Specifically, the waterproofing member 300 is a discrete member. As shown in FIG. 5, the waterproofing member 300 is attached to the housing 200.

Figure 7:
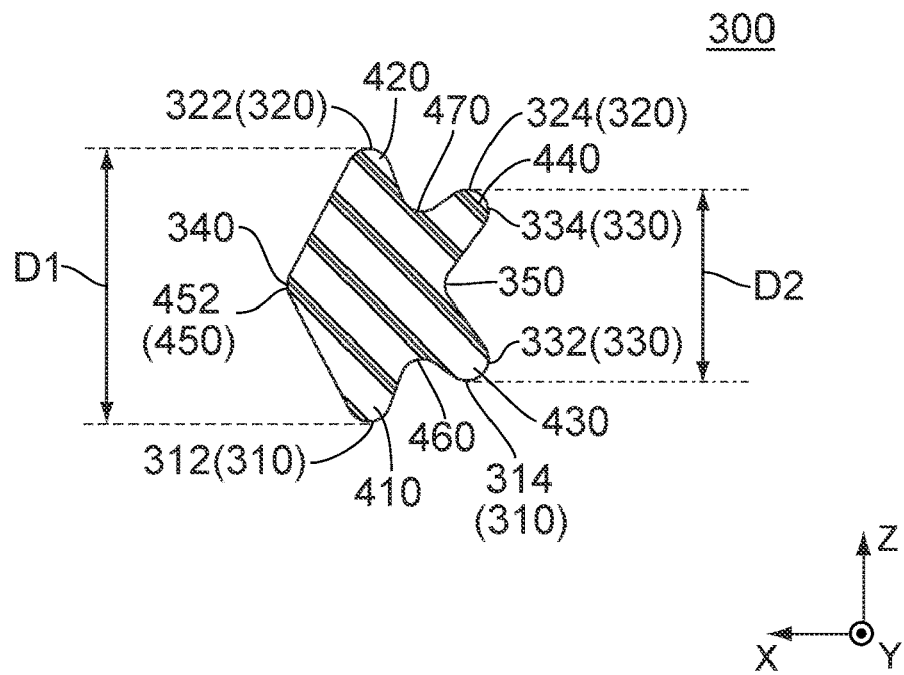
FIG. 7 is a cross-sectional view showing a waterproofing member which is included in the electronic equipment of FIG. 6.

As shown in FIG. 7, in a state before the waterproofing member 300 is attached to the housing 200, the waterproofing member 300 has a shape which is mirror-symmetrical with respect to a plane perpendicular to the first direction. In the present embodiment, the plane perpendicular to the first direction is an XY-plane. In addition, the XY-plane is also referred to as a horizontal plane.

As shown in FIG. 5, the waterproofing member 300 is sandwiched by the bottom portion 210 and the back surface 614 of the main portion 610 in the first direction. More specifically, in the first direction, the waterproofing member 300 is sandwiched by the bottom portion 210 and the back surface 614 of the main portion 610 and is brought into contact with both of the bottom portion 210 and the back surface 614 of the main portion 610. In other words, the electronic equipment 10 forms a waterproof seal between the connector 100 and the case 600 by using the waterproofing member 300.

As shown in FIG. 4, the waterproofing member 300 is sandwiched by the mating connector 800 and the side portion 230 in the second direction perpendicular to the first direction when the connector 100 is mated with the mating connector 800. In other words, when the connector 100 is mated with the mating connector 800, the assembly 870 forms a waterproof seal between the connector 100 and the mating connector 800 by using the waterproofing member 300. Specifically, the electronic equipment 10 of the present embodiment is configured so that the single waterproofing member 300 provides the waterproof seal between the connector 100 and the case 600 and provides the waterproof seal between the connector 100 and the mating connector 800. In other words, the single waterproofing member 300 is brought into contact with three members, namely the connector 100, the case 600 and the mating connector 800, when the connector 100 is mated with the mating connector 800.

As shown in FIG. 7, the waterproofing member 300 has two first contact portions 310, two second contact portions 320, two third contact portions 330 and a fourth contact portion 340. However, the present invention is not limited thereto. Specifically, the waterproofing member 300 should have at least one first contact portion 310, at least one second contact portion 320, at least one third contact portion 330 and at least one fourth contact portion 340.

As shown in FIG. 7, the first contact portions 310 of the present embodiment are positioned away from each other in the second direction in the state before the waterproofing member 300 is attached to the housing 200. As shown in FIG. 5, the first contact portions 310 are positioned away from each other in the second direction under a state where the waterproofing member 300 is attached to the housing 200.

As shown in FIG. 5, each of the first contact portions 310 is pressed against and in contact with the bottom portion 210 in the first direction by the elasticity of the waterproofing member 300.

As shown in FIG. 7, the first contact portions 310 of the present embodiment include a first main contact portion 312 and a first sub contact portion 314. However, the present invention is not limited thereto. Specifically, the first contact portions 310 may not include the first sub contact portion 314.

As shown in FIG. 7, the first main contact portion 312 of the present embodiment defines an outer end of the waterproofing member 300 in the first direction. Specifically, the first main contact portion 312 defines a lower end of the waterproofing member 300 in the up-down direction. The first main contact portion 312 is positioned between the fourth contact portion 340 and any of the third contact portions 330 in the second direction. The first main contact portion 312 is positioned inward in the second direction beyond any of the third contact portions 330. The first main contact portion 312 is positioned outward in the second direction beyond the fourth contact portion 340. As shown in FIG. 5, the first main contact portion 312 is positioned outward in the second direction beyond the opening 616.

As shown in FIG. 5, the first main contact portion 312 of the first contact portions 310 is positioned between the side portion 230 and the fourth contact portion 340 in the second direction. The first main contact portion 312 of the first contact portions 310 is positioned closer to the fourth contact portion 340 than to the side portion 230 in the second direction. More specifically, under the state where the waterproofing member 300 is attached to the housing 200, the first main contact portion 312 of the first contact portions 310 is positioned closer to the fourth contact portion 340 than to the side portion 230 in the second direction.

As shown in FIG. 7, the first sub contact portion 314 of the present embodiment is positioned outward in the second direction beyond the first main contact portion 312. The first sub contact portion 314 is positioned between the fourth contact portion 340 and any of the third contact portions 330 in the second direction. The first sub contact portion 314 is positioned inward in the second direction beyond any of the third contact portions 330. The first sub contact portion 314 is positioned outward in the second direction beyond the fourth contact portion 340.

As shown in FIG. 7, the second contact portions 320 of the present embodiment are positioned away from each other in the second direction in the state before the waterproofing member 300 is attached to the housing 200. As shown in FIG. 5, the second contact portions 320 are positioned away from each other in the second direction under the state where the waterproofing member 300 is attached to the housing 200.

As shown in FIG. 5, each of the second contact portions 320 is pressed against and in contact with the back surface 614 of the main portion 610 in the first direction by the elasticity of the waterproofing member 300.

As shown in FIG. 7, the second contact portions 320 of the present embodiment include a second main contact portion 322 and a second sub contact portion 324. However, the present invention is not limited thereto. Specifically, the second contact portions 320 may not include the second sub contact portion 324.

As shown in FIG. 7, the second main contact portion 322 of the present embodiment defines an outer end of the waterproofing member 300 in the first direction. Specifically, the second main contact portion 322 defines an upper end of the waterproofing member 300 in the up-down direction. The second main contact portion 322 is positioned between the fourth contact portion 340 and any of the third contact portions 330 in the second direction. The second main contact portion 322 is positioned inward in the second direction beyond any of the third contact portions 330. The second main contact portion 322 is positioned outward in the second direction beyond the fourth contact portion 340. As shown in FIG. 5, the second main contact portion 322 is positioned outward in the second direction beyond the opening 616.

As shown in FIG. 5, the second main contact portion 322 of the second contact portions 320 is positioned between the side portion 230 and the fourth contact portion 340 in the second direction. The second main contact portion 322 of the second contact portions 320 is positioned closer to the fourth contact portion 340 than to the side portion 230 in the second direction. More specifically, under the state where the waterproofing member 300 is attached to the housing 200, the second main contact portion 322 of the second contact portions 320 is positioned closer to the fourth contact portion 340 than to the side portion 230 in the second direction.

As shown in FIG. 5, the second main contact portion 322 of the second contact portions 320 is positioned at a position same as a position of the first main contact portion 312 of the first contact portions 310 in the second direction. This enables the waterproofing member 300 to be reliably held by the connector 100 when the waterproofing member 300 is sandwiched by the case 600 and the bottom portion 210 of the housing 200.

As shown in FIG. 7, the second sub contact portion 324 of the present embodiment is positioned between the second main contact portion 322 and any of the third contact portions 330 in the second direction. The second sub contact portion 324 is positioned outward in the second direction beyond the second main contact portion 322. The second sub contact portion 324 is positioned inward in the second direction beyond any of the third contact portions 330. The second sub contact portion 324 is positioned between the fourth contact portion 340 and any of the third contact portions 330 in the second direction. The second sub contact portion 324 is positioned outward in the second direction beyond the fourth contact portion 340.

As shown in FIG. 7, each of the third contact portions 330 of the present embodiment forms a curved surface which protrudes outward in the second direction in the state before the waterproofing member 300 is attached to the housing 200. The third contact portions 330 are positioned away from each other in the first direction in the state before the waterproofing member 300 is attached to the housing 200. As shown in FIG. 5, the third contact portions 330 are positioned away from each other in the first direction under the state where the waterproofing member 300 is attached to the housing 200.

As shown in FIG. 5, each of the third contact portions 330 is in contact with the side portion 230 in the second direction. As shown in FIG. 4, each of the third contact portions 330 is pressed against the side portion 230 in the second direction by the elasticity of the waterproofing member 300 upon the mating of the connector 100 with the mating connector 800.

As shown in FIG. 7, the third contact portions 330 of the present embodiment include a third main contact portion 332 and a third sub contact portion 334.

As shown in FIG. 7, the third main contact portion 332 of the present embodiment defines an outer end of the waterproofing member 300 in the second direction. The third main contact portion 332 is positioned between any of the first contact portions 310 and any of the second contact portions 320 in the first direction. The third main contact portion 332 is positioned inward in the first direction beyond any of the first contact portions 310. The third main contact portion 332 is positioned inward in the first direction beyond any of the second contact portions 320.

As shown in FIG. 7, the third sub contact portion 334 of the present embodiment defines the outer end of the waterproofing member 300 in the second direction. The third sub contact portion 334 is positioned between any of the first contact portions 310 and any of the second contact portions 320 in the first direction. The third sub contact portion 334 is positioned inward in the first direction beyond any of the first contact portions 310. The third sub contact portion 334 is positioned inward in the first direction beyond any of the second contact portions 320. The third sub contact portion 334 is positioned above the third main contact portion 332 in the up-down direction.

As shown in FIG. 5, the fourth contact portion 340 of the present embodiment defines an inner end of the waterproofing member 300 in the second direction. The fourth contact portion 340 protrudes inward in the second direction beyond the opening 616. The fourth contact portion 340 is positioned at a first side of the waterproofing member 300 in the second direction.

Referring to FIGS. 2 and 4, a circumferential length of the fourth contact portion 340 is shorter than a circumferential length of the abutment portion 812 under an unmated state where the connector 100 and the mating connector 800 are not mated with each other. A distance between the fourth contact portion 340 and the third main contact portion 332 in the second direction under the unmated state is greater than a distance between the side portion 230 and the abutment portion 812 in the second direction upon the mating of the connector 100 with the mating connector 800. In addition, a distance between the fourth contact portion 340 and the third sub contact portion 334 in the second direction under the unmated state is greater than the distance between the side portion 230 and the abutment portion 812 in the second direction upon the mating of the connector 100 with the mating connector 800. Thus, as shown in FIG. 4, the fourth contact portion 340 is pressed against and in contact with the mating connector 800 in the second direction by the elasticity of the waterproofing member 300 upon the mating of the connector 100 with the mating connector 800. More specifically, the fourth contact portion 340 is pressed against and in contact with the abutment portion 812 of the mating housing 810 in the second direction by the elasticity of the waterproofing member 300 upon the mating of the connector 100 with the mating connector 800.

As described above, one of the first contact portions 310 is positioned closer to the fourth contact portion 340 than to the side portion 230 in the second direction. Accordingly, even in a case where the fourth contact portion 340 is pushed down upon the mating of the connector 100 with the mating connector 800, the waterproofing member 300 is prevented from being rotated about an axis which is perpendicular to both the first direction and the second direction. Thus, the third contact portions 330 are prevented from being moved upward even in this case.

As shown in FIG. 5, the connector 100 is formed with a space 150 between the waterproofing member 300 and the side portion 230.

As shown in FIG. 5, the space 150 is positioned between the third contact portions 330 in the first direction. Specifically, the space 150 is positioned between the third main contact portion 332 and the third sub contact portion 334 in the first direction. Accordingly, even when the connector 100 is mated with the mating connector 800, the third sub contact portion 334 is hardly moved upward in comparison with an assumption where the waterproofing member 300 be brought into close contact with the side portion 230 without the space 150.

As shown in FIG. 7, the waterproofing member 300 has a first protrusion 410, a second protrusion 420, a third protrusion 430, a fourth protrusion 440 and a fifth protrusion 450.

Referring to FIGS. 5 and 7, the first protrusion 410 of the present embodiment protrudes outward in the first direction. Specifically, the first protrusion 410 protrudes downward in the up-down direction. The first protrusion 410 is positioned at a position same as a position of the second protrusion 420 in the second direction. The first protrusion 410 is positioned between the third protrusion 430 and the fifth protrusion 450 in the second direction. The first protrusion 410 is positioned between the fourth protrusion 440 and the fifth protrusion 450 in the second direction. The first main contact portion 312 of the first contact portions 310 is provided on the first protrusion 410.

Referring to FIGS. 5 and 7, the second protrusion 420 of the present embodiment protrudes outward in the first direction. Specifically, the second protrusion 420 protrudes upward in the up-down direction. The second protrusion 420 is positioned at the position same as the position of the first protrusion 410 in the second direction. The second protrusion 420 is positioned between the third protrusion 430 and the fifth protrusion 450 in the second direction. The second protrusion 420 is positioned between the fourth protrusion 440 and the fifth protrusion 450 in the second direction. The second main contact portion 322 of the second contact portions 320 is provided on the second protrusion 420.

Referring to FIGS. 5 and 7, the third protrusion 430 of the present embodiment protrudes outward in the first direction and extends outward in the second direction. Specifically, the third protrusion 430 protrudes downward in the up-down direction and extends outward in the second direction. The third protrusion 430 is positioned outward in the second direction beyond the first protrusion 410. The third protrusion 430 is positioned outward in the second direction beyond the second protrusion 420. The third protrusion 430 is positioned outward in the second direction beyond the fifth protrusion 450.

As shown in FIG. 7, the first sub contact portion 314 of the first contact portions 310 is provided on the third protrusion 430. Additionally, the third main contact portion 332 of the third contact portions 330 is provided on the third protrusion 430.

As shown in FIG. 7, the waterproofing member 300 is formed with a first valley portion 460 between the first protrusion 410 and the third protrusion 430.

As shown in FIG. 5, the first valley portion 460 of the present embodiment is recessed inward in the first direction. Specifically, the first valley portion 460 is recessed upward in the up-down direction.

Referring to FIGS. 5 and 7, the fourth protrusion 440 of the present embodiment protrudes outward in the first direction and extends outward in the second direction. Specifically, the fourth protrusion 440 protrudes upward in the up-down direction and extends outward in the second direction. The fourth protrusion 440 is positioned outward in the second direction beyond the first protrusion 410. The fourth protrusion 440 is positioned outward in the second direction beyond the second protrusion 420. The fourth protrusion 440 is positioned outward in the second direction beyond the fifth protrusion 450.

As shown in FIG. 5, the second sub contact portion 324 of the second contact portions 320 is provided on the fourth protrusion 440. Additionally, the third sub contact portion 334 of the third contact portions 330 is provided on the fourth protrusion 440.

In the state before the waterproofing member 300 is attached to the housing 200, a distance D1 from an end of the first protrusion 410 to an end of the second protrusion 420 in the first direction is greater than a distance D2 from an end of the third protrusion 430 to an end of the fourth protrusion 440 in the first direction.

As shown in FIG. 5, the fourth protrusion 440 has a fit portion 442.

As shown in FIG. 5, the fit portion 442 of the present embodiment enters into the gap 170 and is brought into close contact with both of the back surface 614 of the case 600 and the side portion 230. This enhances the waterproof seal between the connector 100 and the case 600.

As shown in FIG. 7, the waterproofing member 300 is formed with a second valley portion 470 between the second protrusion 420 and the fourth protrusion 440.

As shown in FIG. 5, the second valley portion 470 of the present embodiment is recessed inward in the first direction. Specifically, the second valley portion 470 is recessed downward in the up-down direction.

As shown in FIG. 7, the waterproofing member 300 is formed with a recess portion 350 between the third protrusion 430 and the fourth protrusion 440. In other words, the waterproofing member 300 has a recess portion 350.

As shown in FIG. 7, the recess portion 350 of the present embodiment is recessed inward in the second direction. In the second direction, the recess portion 350 is positioned at a second side of the waterproofing member 300 which is opposite to the first side of the waterproofing member 300 at which the fifth protrusion 450 is positioned. In the second direction, the recess portion 350 is positioned at the second side of the waterproofing member 300 which is opposite to the first side of the waterproofing member 300 at which the fourth contact portion 340 is positioned. As shown in FIG. 5, the recess portion 350 is positioned away from the side portion 230. Specifically, the recess portion 350 is positioned away from the side portion 230 in the second direction. The space 150 is positioned between the recess portion 350 of the waterproofing member 300 and the side portion 230 of the housing 200.

As described above, the waterproofing member 300 of the present embodiment has the recess portion 350. This facilitates the fourth contact portion 340 to be moved outward in the second direction upon the mating of the connector 100 with the mating connector 800.

As shown in FIG. 7, the fifth protrusion 450 of the present embodiment protrudes inward in the second direction. The fifth protrusion 450 has an obtuse apex 452. The fourth contact portion 340 is provided on the fifth protrusion 450. More specifically, the fourth contact portion 340 is provided on the apex 452. Accordingly, when the connector 100 is mated with the mating connector 800, the waterproofing member 300 is hardly rotated about the axis which is perpendicular to both the first direction and the second direction. Specifically, the fourth contact portion 340 is easily moved outward in the second direction upon the mating of the connector 100 with the mating connector 800. Thus, the mating connector 800 is easily inserted into the connector 100 upon the mating of the connector 100 with the mating connector 800, and the assembly 870 can maintain the waterproof seal between the connector 100 and the mating connector 800 under a mated state where the connector 100 is mated with the mating connector 800.

Second Embodiment

Figure 8:
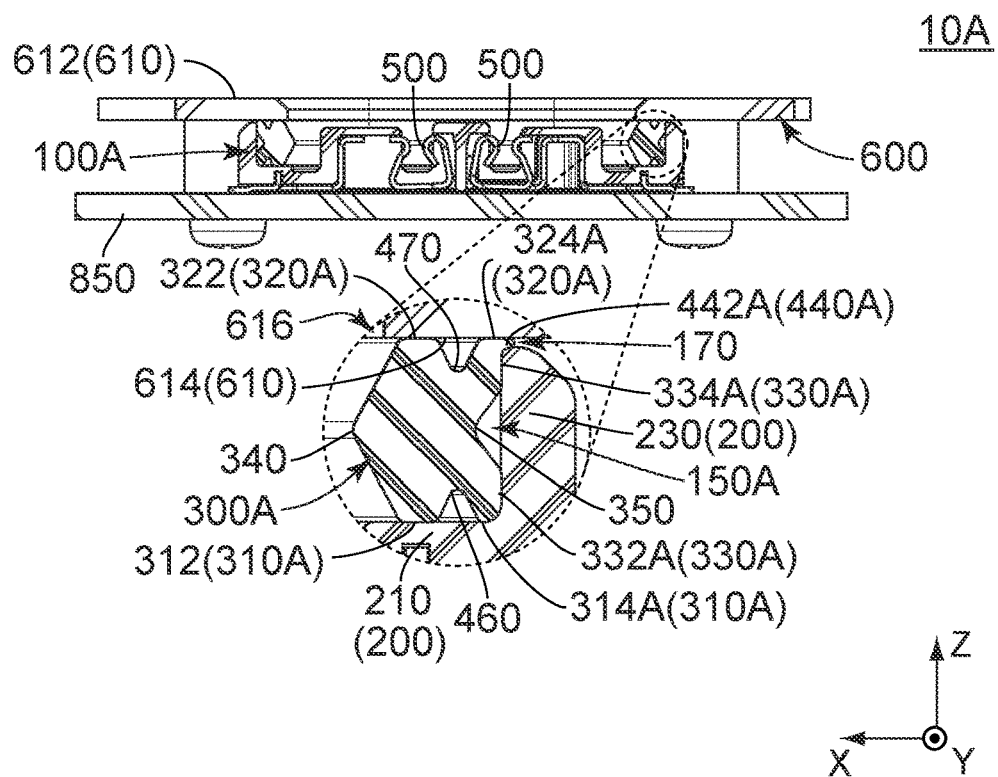
FIG. 8 is a cross-sectional view showing an electronic equipment which is included in an assembly according to a second embodiment of the present invention. In the figure, a part of the electronic equipment is enlarged and illustrated.

Referring to FIG. 8, an assembly (not shown) according to a second embodiment of the present invention comprises an electronic equipment 10A and a mating connector (not shown). The mating connector of the present embodiment has a structure same as that of the first embodiment. Accordingly, a detailed explanation thereabout is omitted. As for directions and orientations in the present embodiment, expressions same as those of the first embodiment will be used hereinbelow.

As shown in FIG. 8, the electronic equipment 10A of the present embodiment comprises a case 600 and a connector 100A. The case 600 of the present embodiment has a structure same as that of the first embodiment. Components of the case 600 of the present embodiment which are same as those of the case 600 of the first embodiment are referred by using reference signs same as those of the case 600 of the first embodiment, and a detailed explanation thereabout is omitted.

As shown in FIG. 8, the connector 100A of the present embodiment comprises a housing 200, a plurality of terminals 500 and a waterproofing member 300A. The housing 200 and the terminal 500 of the present embodiment have structures same as those of the first embodiment. Accordingly, a detailed explanation thereabout is omitted.

Referring to FIG. 8, the waterproofing member 300A of the present embodiment has a rectangular ring shape with rounded corners when viewed along the first direction. The waterproofing member 300A has an elastic property. The waterproofing member 300A is made of seamless rubber. Specifically, the waterproofing member 300A is a discrete member. The waterproofing member 300A is attached to the housing 200. The waterproofing member 300A of the present embodiment has a structure similar to the waterproofing member 300 of the first embodiment. Components of the waterproofing member 300A which are same as those of the waterproofing member 300 of the first embodiment are referred by using reference signs same as those of the waterproofing member 300 of the first embodiment, and a detailed explanation thereabout is omitted.

Figure 9:
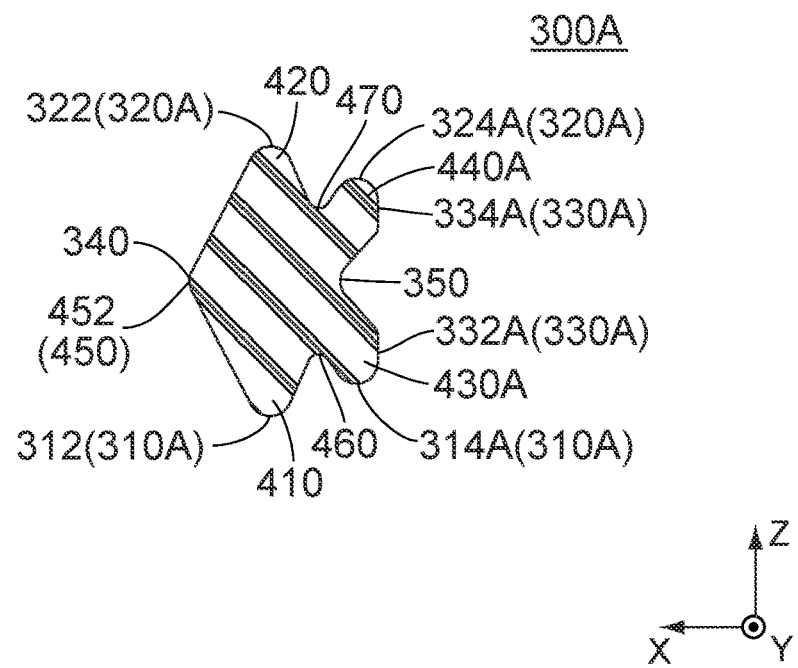
FIG. 9 is a cross-sectional view showing a waterproofing member which is included in the electronic equipment of FIG. 8. In the figure, the waterproofing member is in a state before the waterproofing member is attached to a connector.

As shown in FIG. 9, in a state before the waterproofing member 300A is attached to the housing 200, the waterproofing member 300A has a shape which is mirror-symmetrical with respect to a plane perpendicular to the first direction.

As shown in FIG. 8, the waterproofing member 300A is sandwiched by a bottom portion 210 and a back surface 614 of a main portion 610 in the first direction. More specifically, in the first direction, the waterproofing member 300A is sandwiched by the bottom portion 210 and the back surface 614 of the main portion 610 and is brought into contact with both of the bottom portion 210 and the back surface 614 of the main portion 610. In other words, the electronic equipment 10A forms a waterproof seal between the connector 100A and the case 600 by using the waterproofing member 300A.

Referring to FIG. 8, the waterproofing member 300A is sandwiched by the mating connector and a side portion 230 in the second direction perpendicular to the first direction when the connector 100A is mated with the mating connector. In other words, when the connector 100A is mated with the mating connector, the assembly forms a waterproof seal between the connector 100A and the mating connector by using the waterproofing member 300A. Specifically, the electronic equipment 10A of the present embodiment is configured so that the single waterproofing member 300A provides the waterproof seal between the connector 100A and the case 600 and provides the waterproof seal between the connector 100A and the mating connector. In other words, the single waterproofing member 300A is brought into contact with three members, namely the connector 100A, the case 600 and the mating connector, when the connector 100A is mated with the mating connector.

As shown in FIG. 9, the waterproofing member 300A has two first contact portions 310A, two second contact portions 320A, two third contact portions 330A and a fourth contact portion 340. However, the present invention is not limited thereto. Specifically, the waterproofing member 300A should have at least one first contact portion 310A, at least one second contact portion 320A, at least one third contact portion 330A and at least one fourth contact portion 340. The first contact portion 310A, the second contact portion 320A and the fourth contact portion 340 of the present embodiment have structures same as those of the first contact portion 310, the second contact portion 320 and the fourth contact portion 340 of the first embodiment. Accordingly, a detailed explanation thereabout is omitted.

As shown in FIG. 9, each of the third contact portions 330A of the present embodiment forms a flat surface perpendicular to the second direction in a state before the waterproofing member 300A is attached to the housing 200. The third contact portions 330A are positioned away from each other in the first direction in the state before the waterproofing member 300A is attached to the housing 200. As shown in FIG. 8, the third contact portions 330A are positioned away from each other in the first direction under a state where the waterproofing member 300A is attached to the housing 200.

As shown in FIG. 8, each of the third contact portions 330A is in contact with the side portion 230 in the second direction. Referring to FIG. 8, each of the third contact portions 330A is pressed against the side portion 230 in the second direction by the elasticity of the waterproofing member 300A upon the mating of the connector 100A with the mating connector.

As described above, each of the third contact portions 330A forms the flat surface perpendicular to the second direction in the state before the waterproofing member 300A is attached to the housing 200. Thus, each of the third contact portions 330A of the present embodiment can make large-area contact with the side portion 230 in comparison with the third contact portion 330 of the first embodiment.

As shown in FIG. 9, the third contact portions 330A of the present embodiment include a third main contact portion 332A and a third sub contact portion 334A.

Referring to FIG. 9, the third main contact portion 332A of the present embodiment defines an outer end of the waterproofing member 300A in the second direction. The third main contact portion 332A is positioned between any of the first contact portions 310A and any of the second contact portions 320A in the first direction. The third main contact portion 332A is positioned inward in the first direction beyond any of the first contact portions 310A. The third main contact portion 332A is positioned inward in the first direction beyond any of the second contact portions 320A.

As shown in FIG. 9, the third sub contact portion 334A of the present embodiment defines the outer end of the waterproofing member 300A in the second direction. The third sub contact portion 334A is positioned between any of the first contact portions 310A and any of the second contact portions 320A in the first direction. The third sub contact portion 334A is positioned inward in the first direction beyond any of the first contact portions 310A. The third sub contact portion 334A is positioned inward in the first direction beyond any of the second contact portions 320A. The third sub contact portion 334A is positioned above the third main contact portion 332A in the up-down direction.

As shown in FIG. 8, the connector 100A is formed with a space 150A between the waterproofing member 300A and the side portion 230. The space 150A has a structure similar to that of the space 150 of the first embodiment. Accordingly, a detailed explanation thereabout is omitted.

As shown in FIG. 8, the waterproofing member 300A has a first protrusion 410, a second protrusion 420, a third protrusion 430A, a fourth protrusion 440A and a fifth protrusion 450. The first protrusion 410, the second protrusion 420 and the fifth protrusion 450 of the present embodiment have structures same as those of the first embodiment. Accordingly, a detailed explanation thereabout is omitted.

Referring to FIGS. 8 and 9, the third protrusion 430A of the present embodiment protrudes outward in the first direction and extends outward in the second direction. Specifically, the third protrusion 430A protrudes downward in the up-down direction and extends outward in the second direction. The third protrusion 430A is positioned outward in the second direction beyond the first protrusion 410. The third protrusion 430A is positioned outward in the second direction beyond the second protrusion 420. The third protrusion 430A is positioned outward in the second direction beyond the fifth protrusion 450.

As shown in FIG. 9, a first sub contact portion 314A of the first contact portions 310A is provided on the third protrusion 430A. Additionally, the third main contact portion 332A of the third contact portions 330A is provided on the third protrusion 430A.

Referring to FIGS. 8 and 9, the fourth protrusion 440A of the present embodiment protrudes outward in the first direction and extends outward in the second direction. Specifically, the fourth protrusion 440A protrudes upward in the up-down direction and extends outward in the second direction. The fourth protrusion 440A is positioned outward in the second direction beyond the first protrusion 410. The fourth protrusion 440A is positioned outward in the second direction beyond the second protrusion 420. The fourth protrusion 440A is positioned outward in the second direction beyond the fifth protrusion 450.

As shown in FIG. 9, a second sub contact portion 324A of the second contact portions 320A is provided on the fourth protrusion 440A. Additionally, the third sub contact portion 334A of the third contact portions 330A is provided on the fourth protrusion 440A.

Referring to FIGS. 8 and 9, in the state before the waterproofing member 300A is attached to the housing 200, a distance from an end of the first protrusion 410 to an end of the second protrusion 420 in the first direction is greater than a distance from an end of the third protrusion 430A to an end of the fourth protrusion 440A in the first direction.

As shown in FIG. 8, the fourth protrusion 440A has a fit portion 442A.

As shown in FIG. 8, the fit portion 442A of the present embodiment enters into a gap 170 and is brought into close contact with both of the back surface 614 of the case 600 and the side portion 230. This enhances the waterproof seal between the connector 100A and the case 600.

Third Embodiment

Figure 10:
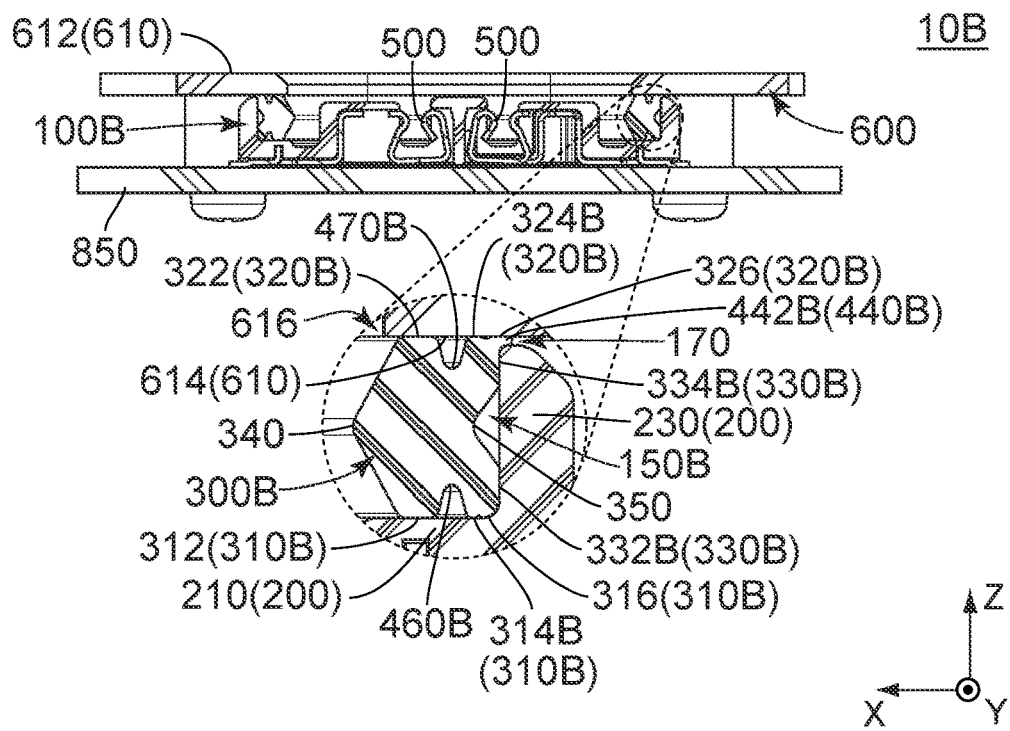
FIG. 10 is a cross-sectional view showing an electronic equipment which is included in an assembly according to a third embodiment of the present invention. In the figure, a part of the electronic equipment is enlarged and illustrated.

Referring to FIG. 10, an assembly (not shown) according to a third embodiment of the present invention comprises an electronic equipment 10B and a mating connector (not shown). The mating connector of the present embodiment has a structure same as that of the first embodiment. Accordingly, a detailed explanation thereabout is omitted. As for directions and orientations in the present embodiment, expressions same as those of the first embodiment will be used hereinbelow.

As shown in FIG. 10, the electronic equipment 10B of the present embodiment comprises a case 600 and a connector 100B. The case 600 of the present embodiment has a structure same as that of the first embodiment. Components of the case 600 of the present embodiment which are same as those of the case 600 of the first embodiment are referred by using reference signs same as those of the case 600 of the first embodiment, and a detailed explanation thereabout is omitted.

As shown in FIG. 10, the connector 100B of the present embodiment comprises a housing 200, a plurality of terminals 500 and a waterproofing member 300B. The housing 200 and the terminal 500 of the present embodiment have structures same as those of the first embodiment. Accordingly, a detailed explanation thereabout is omitted.

Referring to FIG. 10, the waterproofing member 300B of the present embodiment has a rectangular ring shape with rounded corners when viewed along the first direction. The waterproofing member 300B has an elastic property. The waterproofing member 300B is made of seamless rubber. Specifically, the waterproofing member 300B is a discrete member. The waterproofing member 300B is attached to the housing 200. The waterproofing member 300B of the present embodiment has a structure similar to the waterproofing member 300 of the first embodiment. Components of the waterproofing member 300B which are same as those of the waterproofing member 300 of the first embodiment are referred by using reference signs same as those of the waterproofing member 300 of the first embodiment, and a detailed explanation thereabout is omitted.

Figure 11:
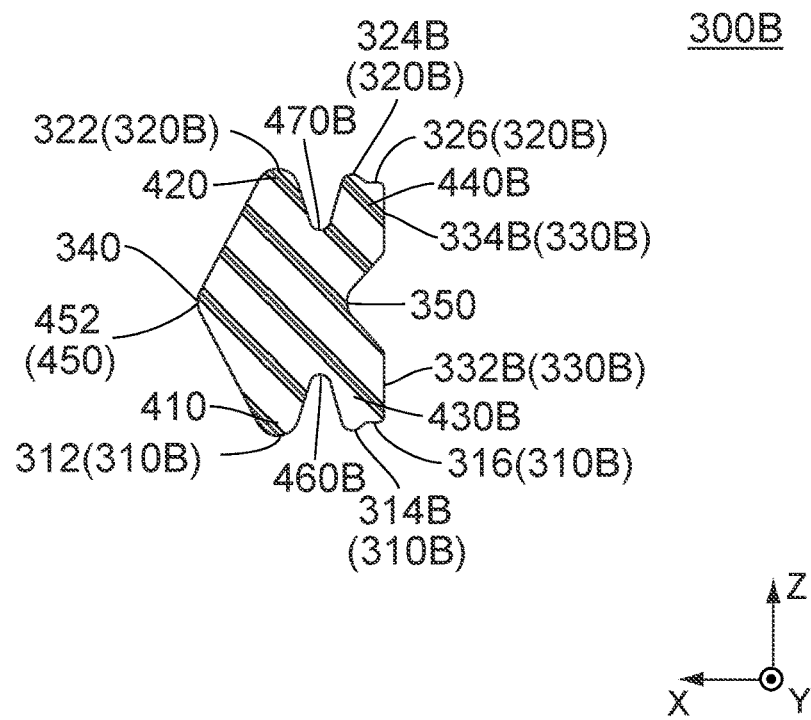
FIG. 11 is a cross-sectional view showing a waterproofing member which is included in the electronic equipment of FIG. 10. In the figure, the waterproofing member is in a state before the waterproofing member is attached to a connector.

As shown in FIG. 11, in a state before the waterproofing member 300B is attached to the housing 200, the waterproofing member 300B has a shape which is mirror-symmetrical with respect to a plane perpendicular to the first direction.

As shown in FIG. 10, the waterproofing member 300B is sandwiched by a bottom portion 210 and a back surface 614 of a main portion 610 in the first direction. More specifically, in the first direction, the waterproofing member 300B is sandwiched by the bottom portion 210 and the back surface 614 of the main portion 610 and is brought into contact with both of the bottom portion 210 and the back surface 614 of the main portion 610. In other words, the electronic equipment 10B forms a waterproof seal between the connector 100B and the case 600 by using the waterproofing member 300B.

Referring to FIG. 10, the waterproofing member 300B is sandwiched by the mating connector and the side portion 230 in the second direction perpendicular to the first direction when the connector 100B is mated with the mating connector. In other words, when the connector 100B is mated with the mating connector, the assembly forms a waterproof seal between the connector 100B and the mating connector by using the waterproofing member 300B. Specifically, the electronic equipment 10B of the present embodiment is configured so that the single waterproofing member 300B provides the waterproof seal between the connector 100B and the case 600 and provides the waterproof seal between the connector 100B and the mating connector. In other words, the single waterproofing member 300B is brought into contact with three members, namely the connector 100B, the case 600 and the mating connector, when the connector 100B is mated with the mating connector.

As shown in FIG. 11, the waterproofing member 300B has three first contact portions 310B, three second contact portions 320B, two third contact portions 330B and a fourth contact portion 340. However, the present invention is not limited thereto. Specifically, the waterproofing member 300B should have at least one first contact portion 310B, at least one second contact portion 320B, at least one third contact portion 330B and at least one fourth contact portion 340. The third contact portions 330B of the present embodiment have structures similar to those of the third contact portions 330A of the second embodiment. Accordingly, a detailed explanation thereabout is omitted. The fourth contact portion 340 of the present embodiment has a structure same as that of the first embodiment. Accordingly, a detailed explanation thereabout is omitted.

As shown in FIG. 11, the first contact portions 310B of the present embodiment are positioned away from one another in the second direction in the state before the waterproofing member 300B is attached to the housing 200. As shown in FIG. 10, the first contact portions 310B are positioned away from one another in the second direction under a state where the waterproofing member 300B is attached to the housing 200.

As shown in FIG. 10, each of the first contact portions 310B is pressed against and in contact with the bottom portion 210 in the first direction by the elasticity of the waterproofing member 300B.

As shown in FIG. 11, the first contact portions 310B of the present embodiment include a first main contact portion 312, a first sub contact portion 314B and a first auxiliary contact portion 316. The first main contact portion 312 of the present embodiment has a structure same as that of the first embodiment. Accordingly, a detailed explanation thereabout is omitted.

As shown in FIG. 10, the first sub contact portion 314B of the present embodiment is positioned outward in the second direction beyond the first main contact portion 312. The first sub contact portion 314B is positioned between the first main contact portion 312 and the first auxiliary contact portion 316 in the second direction. The first sub contact portion 314B is positioned between the fourth contact portion 340 and any of the third contact portions 330B in the second direction. The first sub contact portion 314B is positioned inward in the second direction beyond any of the third contact portions 330B. The first sub contact portion 314B is positioned outward in the second direction beyond the fourth contact portion 340.

As shown in FIG. 10, the first auxiliary contact portion 316 of the present embodiment is positioned outward in the second direction beyond the first sub contact portion 314B. The first auxiliary contact portion 316 is positioned between the fourth contact portion 340 and any of the third contact portions 330B in the second direction. The first auxiliary contact portion 316 is positioned inward in the second direction beyond any of the third contact portions 330B. The first auxiliary contact portion 316 is positioned outward in the second direction beyond the fourth contact portion 340.

As shown in FIG. 11, the second contact portions 320B of the present embodiment are positioned away from one another in the second direction in the state before the waterproofing member 300B is attached to the housing 200. As shown in FIG. 10, the second contact portions 320B are positioned away from one another in the second direction under the state where the waterproofing member 300B is attached to the housing 200.

As shown in FIG. 10, each of the second contact portions 320B is pressed against and in contact with the back surface 614 of the main portion 610 in the first direction by the elasticity of the waterproofing member 300B.

As shown in FIG. 11, the second contact portions 320B of the present embodiment include a second main contact portion 322, a second sub contact portion 324B and a second auxiliary contact portion 326. The second main contact portion 322 of the present embodiment has a structure same as that of the first embodiment. Accordingly, a detailed explanation thereabout is omitted.

As shown in FIG. 10, the second sub contact portion 324B of the present embodiment is positioned outward in the second direction beyond the second main contact portion 322. The second sub contact portion 324B is positioned between the second main contact portion 322 and the second auxiliary contact portion 326 in the second direction. The second sub contact portion 324B is positioned between the fourth contact portion 340 and any of the third contact portions 330B in the second direction. The second sub contact portion 324B is positioned inward in the second direction beyond any of the third contact portions 330B. The second sub contact portion 324B is positioned outward in the second direction beyond the fourth contact portion 340.

As shown in FIG. 10, the second auxiliary contact portion 326 of the present embodiment is positioned outward in the second direction beyond the second sub contact portion 324B. The second auxiliary contact portion 326 is positioned between the fourth contact portion 340 and any of the third contact portions 330B in the second direction. The second auxiliary contact portion 326 is positioned inward in the second direction beyond any of the third contact portions 330B. The second auxiliary contact portion 326 is positioned outward in the second direction beyond the fourth contact portion 340.

As shown in FIG. 10, the connector 100B is formed with a space 150B between the waterproofing member 300B and the side portion 230. The space 150B has a structure similar to that of the space 150 of the first embodiment. Accordingly, a detailed explanation thereabout is omitted.

As shown in FIG. 11, the waterproofing member 300B has a first protrusion 410, a second protrusion 420, a third protrusion 430B, a fourth protrusion 440B and a fifth protrusion 450. The first protrusion 410, the second protrusion 420 and the fifth protrusion 450 of the present embodiment have structures same as those of the first embodiment. Accordingly, a detailed explanation thereabout is omitted.

Referring to FIGS. 10 and 11, the third protrusion 430B of the present embodiment protrudes outward in the first direction and extends outward in the second direction. Specifically, the third protrusion 430B protrudes downward in the up-down direction and extends outward in the second direction. The third protrusion 430B is positioned outward in the second direction beyond the first protrusion 410. The third protrusion 430B is positioned outward in the second direction beyond the second protrusion 420. The third protrusion 430B is positioned outward in the second direction beyond the fifth protrusion 450.

As shown in FIG. 11, the first sub contact portion 314B and the first auxiliary contact portion 316 of the first contact portions 310B are provided on the third protrusion 430B. Additionally, a third main contact portion 332B of the third contact portions 330B is provided on the third protrusion 430B.

As shown in FIG. 11, the waterproofing member 300B is formed with a first valley portion 460B between the first protrusion 410 and the third protrusion 430B. The first valley portion 460B has a structure similar to that of the first valley portion 460 of the first embodiment. Accordingly, a detailed explanation thereabout is omitted.

Referring to FIGS. 10 and 11, the fourth protrusion 440B of the present embodiment protrudes outward in the first direction and extends outward in the second direction. Specifically, the fourth protrusion 440B protrudes upward in the up-down direction and extends outward in the second direction. The fourth protrusion 440B is positioned outward in the second direction beyond the first protrusion 410. The fourth protrusion 440B is positioned outward in the second direction beyond the second protrusion 420. The fourth protrusion 440B is positioned outward in the second direction beyond the fifth protrusion 450.

As shown in FIG. 11, the second sub contact portion 324B and the second auxiliary contact portion 326 of the second contact portions 320B are provided on the fourth protrusion 440B. Additionally, a third sub contact portion 334B of the third contact portions 330B is provided on the fourth protrusion 440B.

Referring to FIGS. 10 and 11, in the state before the waterproofing member 300B is attached to the housing 200, a distance from an end of the first protrusion 410 to an end of the second protrusion 420 in the first direction is greater than a distance from an end of the third protrusion 430B to an end of the fourth protrusion 440B in the first direction.

As shown in FIG. 10, the fourth protrusion 440B has a fit portion 442B.

As shown in FIG. 10, the fit portion 442B of the present embodiment enters into a gap 170 and is brought into close contact with both of the back surface 614 of the case 600 and the side portion 230. This enhances the waterproof seal between the connector 100B and the case 600.

As shown in FIG. 11, the waterproofing member 300B is formed with a second valley portion 470B between the second protrusion 420 and the fourth protrusion 440B. The second valley portion 470B has a structure similar to that of the second valley portion 470 of the first embodiment. Accordingly, a detailed explanation thereabout is omitted.

Fourth Embodiment

Figure 12:
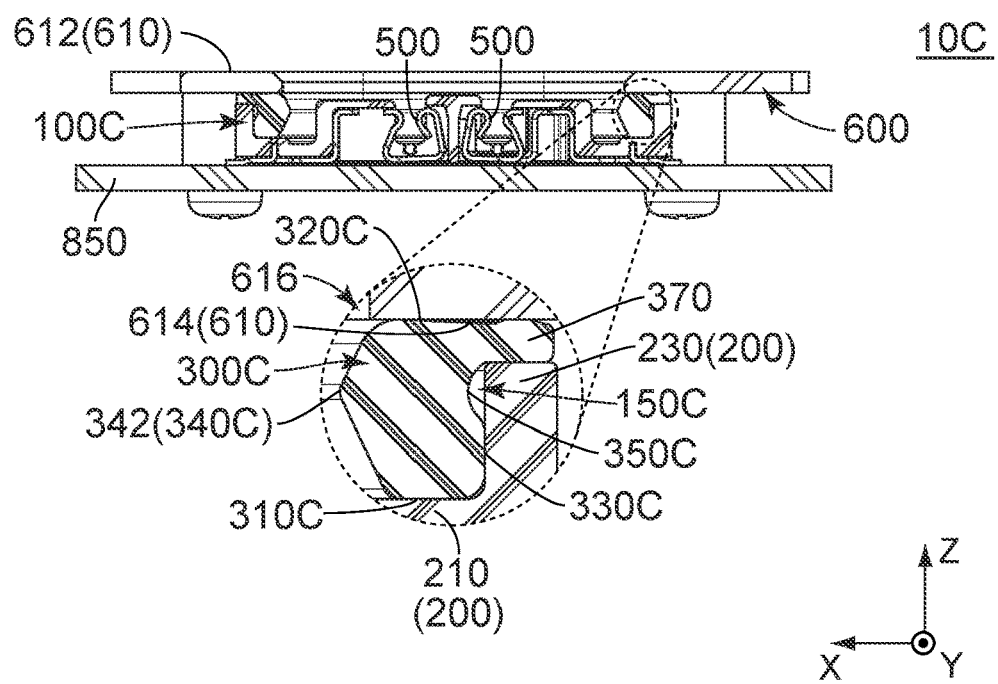
FIG. 12 is a cross-sectional view showing an electronic equipment which is included in an assembly according to a fourth embodiment of the present invention. In the figure, a part of the electronic equipment is enlarged and illustrated.

Referring to FIG. 12, an assembly (not shown) according to a fourth embodiment of the present invention comprises an electronic equipment 10C and a mating connector (not shown). The mating connector of the present embodiment has a structure same as that of the first embodiment. Accordingly, a detailed explanation thereabout is omitted. As for directions and orientations in the present embodiment, expressions same as those of the first embodiment will be used hereinbelow.

As shown in FIG. 12, the electronic equipment 10C of the present embodiment comprises a case 600 and a connector 100C. The case 600 of the present embodiment has a structure same as that of the first embodiment. Components of the case 600 of the present embodiment which are same as those of the case 600 of the first embodiment are referred by using reference signs same as those of the case 600 of the first embodiment, and a detailed explanation thereabout is omitted.

As shown in FIG. 12, the connector 100C of the present embodiment comprises a housing 200, a plurality of terminals 500 and a waterproofing member 300C. The housing 200 and the terminal 500 of the present embodiment have structures same as those of the first embodiment. Accordingly, a detailed explanation thereabout is omitted.

Referring to FIG. 12, the waterproofing member 300C of the present embodiment has a rectangular ring shape with rounded corners when viewed along the first direction. The waterproofing member 300C has an elastic property. The waterproofing member 300C is made of seamless rubber. Specifically, the waterproofing member 300C is a discrete member. The waterproofing member 300C is attached to the housing 200.

As shown in FIG. 12, the waterproofing member 300C is sandwiched by a bottom portion 210 and a back surface 614 of a main portion 610 in the first direction. More specifically, in the first direction, the waterproofing member 300C is sandwiched by the bottom portion 210 and the back surface 614 of the main portion 610 and is brought into contact with both of the bottom portion 210 and the back surface 614 of the main portion 610. In other words, the electronic equipment 10C forms a waterproof seal between the connector 100C and the case 600 by using the waterproofing member 300C.

Referring to FIG. 12, the waterproofing member 300C is sandwiched by the mating connector and a side portion 230 in the second direction perpendicular to the first direction when the connector 100C is mated with the mating connector. In other words, when the connector 100C is mated with the mating connector, the assembly forms a waterproof seal between the connector 100C and the mating connector by using the waterproofing member 300C. Specifically, the electronic equipment 10C of the present embodiment is configured so that the single waterproofing member 300C provides the waterproof seal between the connector 100C and the case 600 and provides the waterproof seal between the connector 100C and the mating connector. In other words, the single waterproofing member 300C is brought into contact with three members, namely the connector 100C, the case 600 and the mating connector, when the connector 100C is mated with the mating connector.

Figure 13:
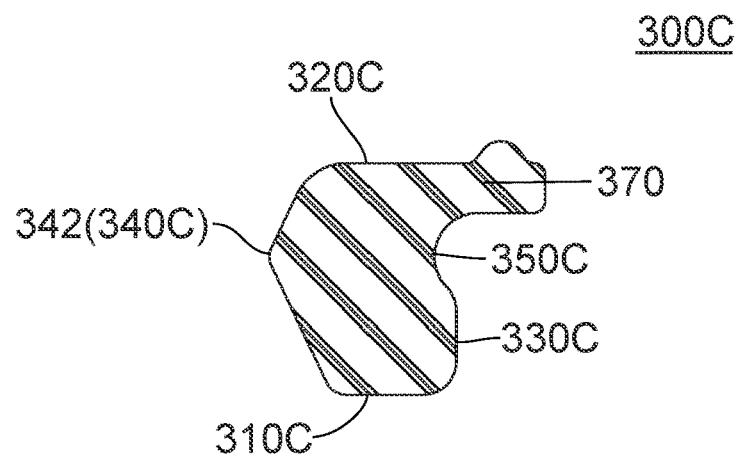
FIG. 13 is a cross-sectional view showing a waterproofing member which is included in the electronic equipment of FIG. 12. In the figure, the waterproofing member is in a state before the waterproofing member is attached to a connector.

As shown in FIG. 13, the waterproofing member 300C has a first contact portion 310C, a second contact portion 320C, a third contact portion 330C and a fourth contact portion 340C.

As shown in FIG. 13, the first contact portion 310C faces outward in the first direction. Specifically, the first contact portion 310C faces downward in the up-down direction. As shown in FIG. 12, the first contact portion 310C is pressed against and in contact with the bottom portion 210 in the first direction by the elasticity of the waterproofing member 300C.

As shown in FIG. 13, the second contact portion 320C faces outward in the first direction. Specifically, the second contact portion 320C faces upward in the up-down direction. As shown in FIG. 12, the second contact portion 320C is pressed against and in contact with the back surface 614 of the main portion 610 in the first direction by the elasticity of the waterproofing member 300C.

As shown in FIG. 13, the third contact portion 330C faces outward in the second direction. As shown in FIG. 12, the third contact portion 330C is in contact with the side portion 230 in the second direction. Referring to FIG. 12, the third contact portion 330C is pressed against the side portion 230 in the second direction by the elasticity of the waterproofing member 300C upon the mating of the connector 100C with the mating connector.

As shown in FIG. 12, the fourth contact portion 340C of the present embodiment protrudes inward in the second direction beyond an opening 616. The fourth contact portion 340C has an obtuse apex 342. The fourth contact portion 340C is positioned at a first side of the waterproofing member 300C in the second direction.

Referring to FIG. 12, a circumferential length of the fourth contact portion 340C is shorter than a circumferential length of an abutment portion (not shown) of a mating housing (not shown) of the mating connector under an unmated state where the connector 100C and the mating connector are not mated with each other. A distance between the fourth contact portion 340C and the third contact portion 330C in the second direction under the unmated state is greater than a distance between the side portion 230 and the abutment portion in the second direction upon the mating of the connector 100C with the mating connector. Thus, the fourth contact portion 340C is pressed against and in contact with the mating connector in the second direction by the elasticity of the waterproofing member 300C upon the mating of the connector 100C with the mating connector. More specifically, the fourth contact portion 340C is pressed against and in contact with the abutment portion of the mating housing in the second direction by the elasticity of the waterproofing member 300C upon the mating of the connector 100C with the mating connector.

As shown in FIG. 12, the connector 100C is formed with a space 150C between the waterproofing member 300C and the side portion 230. Furthermore, the waterproofing member 300C has a recess portion 350C.

As shown in FIG. 12, the recess portion 350C of the present embodiment is recessed inward in the second direction. In the second direction, the recess portion 350C is positioned at a second side of the waterproofing member 300C which is opposite to the first side of the waterproofing member 300C at which the fourth contact portion 340C is positioned. The recess portion 350C is positioned away from the side portion 230. Specifically, the recess portion 350C is positioned away from the side portion 230 in the second direction. The recess portion 350C is positioned closer to the second contact portion 320C than to the first contact portion 310C in the first direction. The space 150C is positioned between the recess portion 350C of the waterproofing member 300C and the side portion 230 of the housing 200.

As described above, the waterproofing member 300C of the present embodiment has the recess portion 350C. This facilitates the fourth contact portion 340C to be moved outward in the second direction upon the mating of the connector 100C with the mating connector.

As shown in FIG. 13, the waterproofing member 300C of the present embodiment has a sandwiched portion 370. The sandwiched portion 370 extends outward in the second direction. The sandwiched portion 370 defines an outer end of the waterproofing member 300C in the second direction. As shown in FIG. 12, the sandwiched portion 370 is sandwiched by the case 600 and the side portion 230 in the first direction. This enables the waterproofing member 300C to be reliably held by the electronic equipment 10C.

Fifth Embodiment

Figure 14:
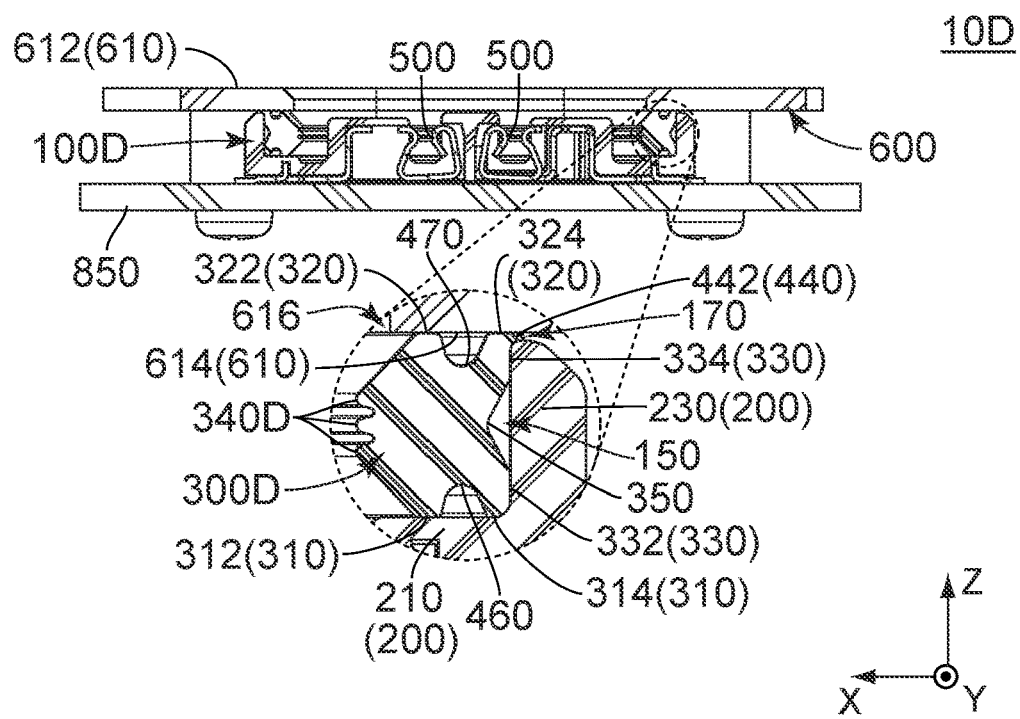
FIG. 14 is a cross-sectional view showing an electronic equipment which is included in an assembly according to a fifth embodiment of the present invention. In the figure, a part of the electronic equipment is enlarged and illustrated.

Referring to FIG. 14, an assembly (not shown) according to a fifth embodiment of the present invention comprises an electronic equipment 10D and a mating connector (not shown). The mating connector of the present embodiment has a structure same as that of the first embodiment. Accordingly, a detailed explanation thereabout is omitted. As for directions and orientations in the present embodiment, expressions same as those of the first embodiment will be used hereinbelow.

As shown in FIG. 14, the electronic equipment 10D of the present embodiment comprises a case 600 and a connector 100D. The case 600 of the present embodiment has a structure same as that of the first embodiment. Components of the case 600 of the present embodiment which are same as those of the case 600 of the first embodiment are referred by using reference signs same as those of the case 600 of the first embodiment, and a detailed explanation thereabout is omitted.

As shown in FIG. 14, the connector 100D of the present embodiment comprises a housing 200, a plurality of terminals 500 and a waterproofing member 300D. The housing 200 and the terminal 500 of the present embodiment have structures same as those of the first embodiment. Accordingly, a detailed explanation thereabout is omitted.

Referring to FIG. 14, the waterproofing member 300D of the present embodiment has a rectangular ring shape with rounded corners when viewed along the first direction. The waterproofing member 300D has an elastic property. The waterproofing member 300D is made of seamless rubber. Specifically, the waterproofing member 300D is a discrete member. The waterproofing member 300D is attached to the housing 200. The waterproofing member 300D of the present embodiment has a structure similar to the waterproofing member 300 of the first embodiment. Components of the waterproofing member 300D which are same as those of the waterproofing member 300 of the first embodiment are referred by using reference signs same as those of the waterproofing member 300 of the first embodiment, and a detailed explanation thereabout is omitted.

Figure 15:
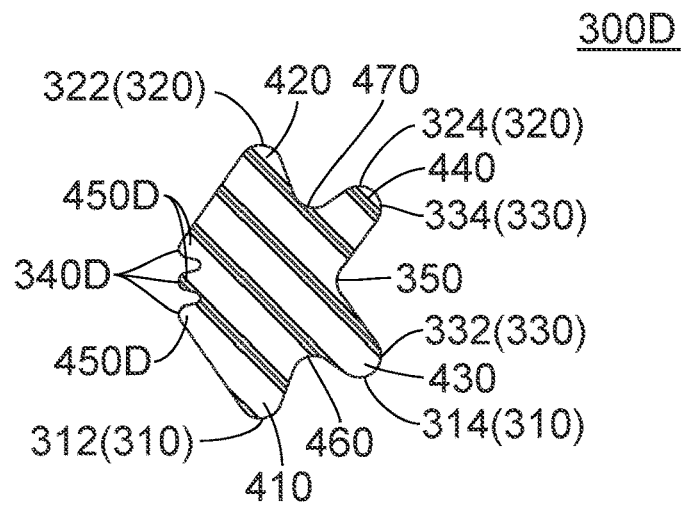
FIG. 15 is a cross-sectional view showing a waterproofing member which is included in the electronic equipment of FIG. 14. In the figure, the waterproofing member is in a state before the waterproofing member is attached to a connector.

As shown in FIG. 15, in a state before the waterproofing member 300D is attached to the housing 200, the waterproofing member 300D has a shape which is mirror-symmetrical with respect to a plane perpendicular to the first direction.

As shown in FIG. 14, the waterproofing member 300D is sandwiched by a bottom portion 210 and a back surface 614 of a main portion 610 in the first direction. More specifically, in the first direction, the waterproofing member 300D is sandwiched by the bottom portion 210 and the back surface 614 of the main portion 610 and is brought into contact with both of the bottom portion 210 and the back surface 614 of the main portion 610. In other words, the electronic equipment 10D forms a waterproof seal between the connector 100D and the case 600 by using the waterproofing member 300D.

Referring to FIG. 14, the waterproofing member 300D is sandwiched by the mating connector and the side portion 230 in the second direction perpendicular to the first direction when the connector 100D is mated with the mating connector. In other words, when the connector 100D is mated with the mating connector, the assembly forms a waterproof seal between the connector 100D and the mating connector by using the waterproofing member 300D. Specifically, the electronic equipment 10D of the present embodiment is configured so that the single waterproofing member 300D provides the waterproof seal between the connector 100D and the case 600 and provides the waterproof seal between the connector 100D and the mating connector. In other words, the single waterproofing member 300D is brought into contact with three members, namely the connector 100D, the case 600 and the mating connector, when the connector 100D is mated with the mating connector.

As shown in FIG. 15, the waterproofing member 300D has two first contact portions 310, two second contact portions 320, two third contact portions 330 and a plurality of fourth contact portions 340D. More specifically, the number of the fourth contact portions 340D of the present embodiment is three. However, the present invention is not limited thereto. Specifically, the waterproofing member 300D should have at least one first contact portion 310, at least one second contact portion 320, at least one third contact portion 330 and at least one fourth contact portion 340D. The first contact portion 310, the second contact portion 320 and the third contact portion 330 of the present embodiment have structures same as those of the first embodiment. Accordingly, a detailed explanation thereabout is omitted.

As shown in FIG. 14, each of the fourth contact portions 340D of the present embodiment protrudes inward in the second direction beyond an opening 616. Each of the fourth contact portions 340D is positioned at a first side of the waterproofing member 300 in the second direction.

Referring to FIG. 14, a circumferential length of each of the fourth contact portions 340D is shorter than a circumferential length of an abutment portion (not shown) of a mating housing (not shown) of the mating connector under an unmated state where the connector 100D and the mating connector are not mated with each other. A distance between a third main contact portion 332 and any of the fourth contact portions 340D in the second direction under the unmated state is greater than a distance between the side portion 230 and the abutment portion in the second direction upon the mating of the connector 100D with the mating connector. Additionally, a distance between a third sub contact portion 334 and any of the fourth contact portions 340D in the second direction under the unmated state is greater than the distance between the side portion 230 and the abutment portion in the second direction upon the mating of the connector 100D with the mating connector. Thus, each of the fourth contact portions 340D is pressed against and in contact with the mating connector in the second direction by the elasticity of the waterproofing member 300D upon the mating of the connector 100D with the mating connector. More specifically, each of the fourth contact portions 340D is pressed against and in contact with the abutment portion of the mating housing in the second direction by the elasticity of the waterproofing member 300D upon the mating of the connector 100D with the mating connector.

As shown in FIG. 15, the waterproofing member 300D has a first protrusion 410, a second protrusion 420, a third protrusion 430, a fourth protrusion 440 and a plurality of fifth protrusions 450D. More specifically, the number of the fifth protrusions 450D of the present embodiment is three. The first protrusion 410, the second protrusion 420, the third protrusion 430 and the fourth protrusion 440 of the present embodiment have structures same as those of the first embodiment. Accordingly, a detailed explanation thereabout is omitted.

As shown in FIG. 15, each of the fifth protrusions 450D of the present embodiment protrudes inward in the second direction. The fourth contact portions 340D are provided on the fifth protrusions 450D, respectively. Accordingly, the fourth contact portions 340D are hardly dragged to be moved downward by the mating connector upon the mating of the connector 100D with the mating connector. Specifically, each of the fourth contact portions 340D is easily moved outward in the second direction upon the mating of the connector 100D with the mating connector. Thus, the mating connector is easily inserted into the connector 100D upon the mating of the connector 100 with the mating connector, and the assembly can maintain the waterproof seal between the connector 100D and the mating connector under a mated state where the connector 100D is mated with the mating connector.

As shown in FIG. 14, in the second direction, a recess portion 350 of the present embodiment is positioned at a second side of the waterproofing member 300D which is opposite to the first side of the waterproofing member 300D at which each of the fourth contact portions 340D is positioned.

As apparent from above, the waterproofing member 300D of the present embodiment has the recess portion 350. This facilitates each of the fourth contact portions 340D to be moved outward in the second direction upon the mating of the connector 100D with the mating connector.

Sixth Embodiment

Figure 16:
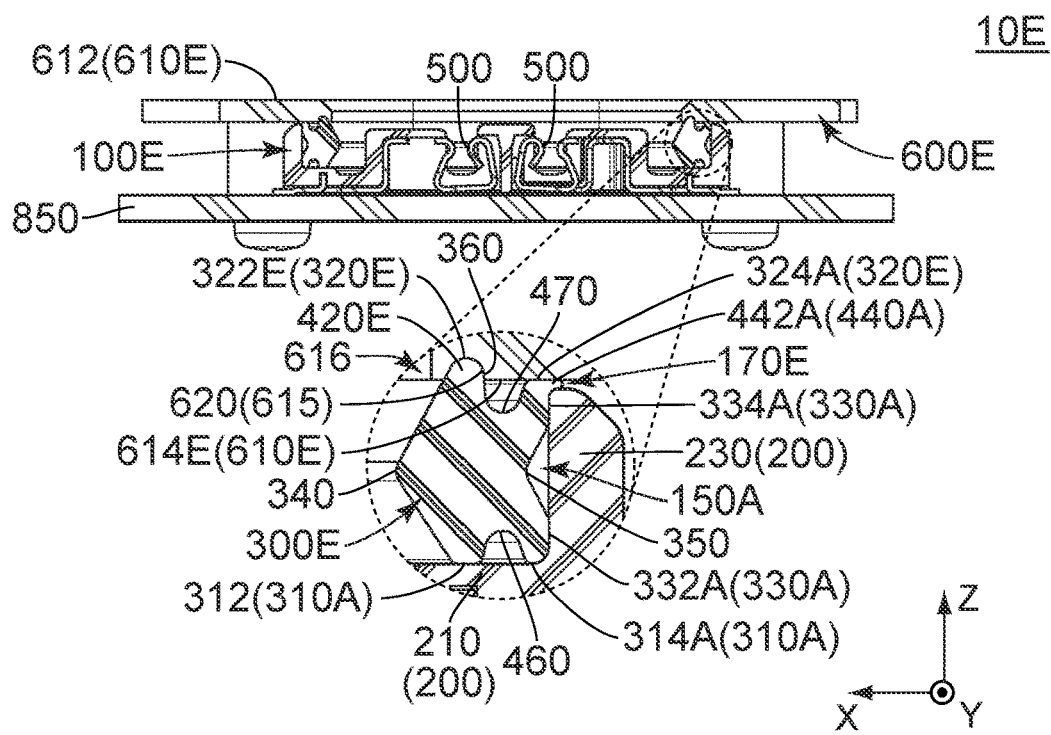
FIG. 16 is a cross-sectional view showing an electronic equipment which is included in an assembly according to a sixth embodiment of the present invention. In the figure, a part of the electronic equipment is enlarged and illustrated.

Referring to FIG. 16, an assembly (not shown) according to a sixth embodiment of the present invention comprises an electronic equipment 10E and a mating connector (not shown). The mating connector of the present embodiment has a structure same as that of the first embodiment. Accordingly, a detailed explanation thereabout is omitted. As for directions and orientations in the present embodiment, expressions same as those of the first embodiment will be used hereinbelow.

As shown in FIG. 16, the electronic equipment 10E of the present embodiment comprises a case 600E and a connector 100E.

Referring to FIG. 16, the case 600E of the present embodiment is made of resin. The case 600E has a main portion 610E.

Referring to FIG. 16, the main portion 610E of the present embodiment has a flat-plate shape perpendicular to the first direction. The main portion 610E has a top surface 612 and a back surface 614E in the first direction. The main portion 610E is provided with an opening 616. The opening 616 pierces the main portion 610E in the first direction.

As shown in FIG. 16, the case 600E has a ditch 615. The ditch 615 is recessed outward in the first direction. More specifically, the ditch 615 is recessed upward in the up-down direction. The ditch 615 forms a part of the back surface 614E. The ditch 615 has a receiving portion 620. In other words, the case 600E has the receiving portion 620. The receiving portion 620 faces inward in the second direction.

As shown in FIG. 16, the connector 100E of the present embodiment comprises a housing 200, a plurality of terminals 500 and a waterproofing member 300E. The housing 200 and the terminal 500 of the present embodiment have structures same as those of the first embodiment. Accordingly, a detailed explanation thereabout is omitted.

As shown in FIG. 16, a bottom portion 210 of the housing 200 is positioned away from the back surface 614E of the main portion 610E in the first direction. A side portion 230 of the housing 200 extends from the bottom portion 210 toward the back surface 614E of the main portion 610E in the first direction. The electronic equipment 10E is formed with a gap 170E between the case 600E and the side portion 230 of the housing 200. In other words, the back surface 614E of the main portion 610E and the side portion 230 of the housing 200 are spaced away from each other in the first direction.

Referring to FIG. 16, the waterproofing member 300E of the present embodiment has a rectangular ring shape with rounded corners when viewed along the first direction. The waterproofing member 300E has an elastic property. The waterproofing member 300E is made of seamless rubber. Specifically, the waterproofing member 300E is a discrete member. The waterproofing member 300E is attached to the housing 200. The waterproofing member 300E of the present embodiment has a structure similar to the waterproofing member 300A of the second embodiment. Components of the waterproofing member 300E which are same as those of the waterproofing member 300A of the second embodiment are referred by using reference signs same as those of the waterproofing member 300A of the second embodiment, and a detailed explanation thereabout is omitted.

As shown in FIG. 16, the waterproofing member 300E is sandwiched by the bottom portion 210 and the back surface 614E of the main portion 610E in the first direction. More specifically, in the first direction, the waterproofing member 300E is sandwiched by the bottom portion 210 and the back surface 614E of the main portion 610E and is brought into contact with both of the bottom portion 210 and the back surface 614E of the main portion 610E. In other words, the electronic equipment 10E forms a waterproof seal between the connector 100E and the case 600E by using the waterproofing member 300E.

Referring to FIG. 16, the waterproofing member 300E is sandwiched by the mating connector and the side portion 230 in the second direction perpendicular to the first direction when the connector 100E is mated with the mating connector. In other words, when the connector 100E is mated with the mating connector, the assembly forms a waterproof seal between the connector 100E and the mating connector by using the waterproofing member 300E. Specifically, the electronic equipment 10E of the present embodiment is configured so that the single waterproofing member 300E provides the waterproof seal between the connector 100E and the case 600E and provides the waterproof seal between the connector 100E and the mating connector. In other words, the single waterproofing member 300E is brought into contact with three members, namely the connector 100E, the case 600E and the mating connector, when the connector 100E is mated with the mating connector.

Figure 17:
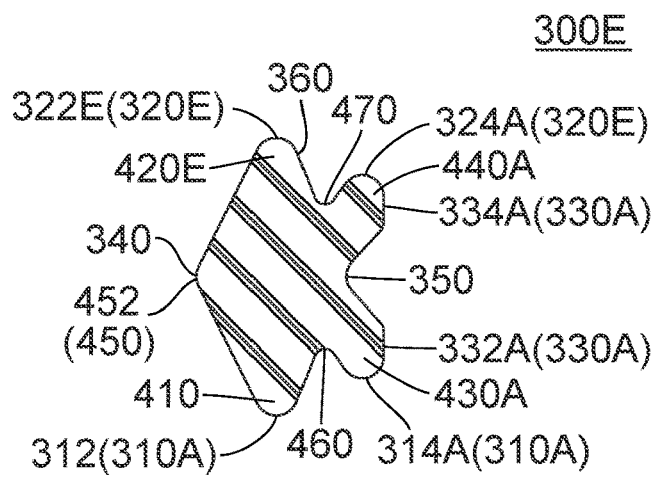
FIG. 17 is a cross-sectional view showing a waterproofing member which is included in the electronic equipment of FIG. 16. In the figure, the waterproofing member is in a state before the waterproofing member is attached to a connector.
Figure 17:
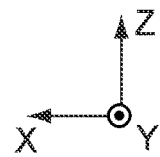
Figure 18:
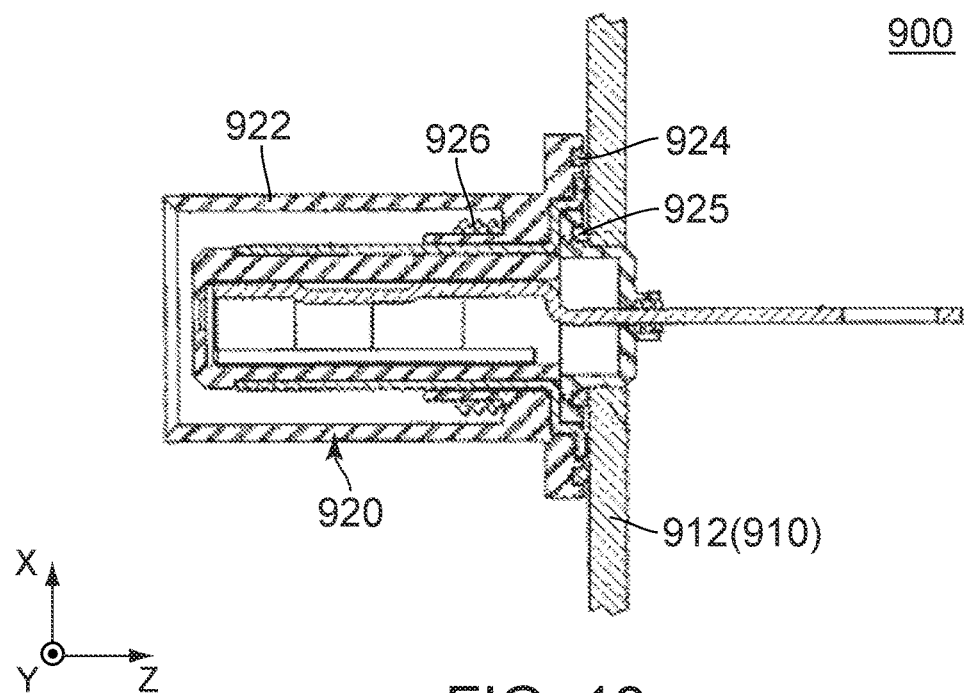
FIG. 18 is a cross-sectional view showing an electronic equipment of Patent Document 1.

As shown in FIG. 17, the waterproofing member 300E has two first contact portions 310A, two second contact portions 320E, two third contact portions 330A and a fourth contact portion 340. However, the present invention is not limited thereto. Specifically, the waterproofing member 300E should have at least one first contact portion 310A, at least one second contact portion 320E, at least one third contact portion 330A and at least one fourth contact portion 340. The first contact portion 310A, the third contact portion 330A and the fourth contact portion 340 of the present embodiment have structures same as those of the second embodiment. Accordingly, a detailed explanation thereabout is omitted.

As shown in FIG. 17, the second contact portions 320E of the present embodiment are positioned away from each other in the second direction in a state before the waterproofing member 300E is attached to the housing 200. As shown in FIG. 16, the second contact portions 320E are positioned away from each other in the second direction under a state where the waterproofing member 300E is attached to the housing 200.

As shown in FIG. 16, each of the second contact portions 320E is pressed against and in contact with the back surface 614E of the main portion 610E in the first direction by the elasticity of the waterproofing member 300E.

As shown in FIG. 17, the second contact portions 320E include a second main contact portion 322E and a second sub contact portion 324A. As shown in FIG. 16, under the state where the waterproofing member 300E is attached to the housing 200, the second main contact portion 322E is pressed against and in contact with the ditch 615 in the first direction by the elasticity of the waterproofing member 300E. The second main contact portion 322E and the second sub contact portion 324A of the present embodiment have structures same as those of the second main contact portion 322 and the second sub contact portion 324A of the second embodiment. Accordingly, a detailed explanation thereabout is omitted.

As shown in FIG. 17, the waterproofing member 300E has a first protrusion 410, a second protrusion 420E, a third protrusion 430A, a fourth protrusion 440A and a fifth protrusion 450. The first protrusion 410, the third protrusion 430A, the fourth protrusion 440A and the fifth protrusion 450 have structures same as those of the second embodiment. Accordingly, a detailed explanation thereabout is omitted.

As shown in FIG. 17, the second main contact portion 322E of the second contact portions 320E is provided on the second protrusion 420E. As shown in FIG. 16, the second protrusion 420E is received in the ditch 615 under the state where the waterproofing member 300E is attached to the housing 200.

As shown in FIG. 17, the second protrusion 420E is provided with a received portion 360. In other words, the waterproofing member 300E has the received portion 360.

As shown in FIG. 16, the received portion 360 of the present embodiment faces outward in the second direction. The received portion 360 neighbors to the second main contact portion 322E of the second contact portions 320E in the second direction. The received portion 360 is provided at a location between the second main contact portion 322E of the second contact portions 320E and the side portion 230 in the second direction. Referring to FIG. 16, the received portion 360 is pressed against the receiving portion 620 upon the mating of the connector 100E with the mating connector. This can form a reliable waterproof seal between the case 600E and the housing 200 in the electronic equipment 10E of the present embodiment.

As shown in FIG. 16, a fit portion 442A of the present embodiment enters into the gap 170E and is brought into close contact with both of the back surface 614E of the case 600E and the side portion 230. This enhances the waterproof seal between the connector 100E and the case 600E.

Although the specific explanation about the present invention is made above referring to the embodiments, the present invention is not limited thereto and is susceptible to various modifications and alternative forms.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An electronic equipment comprising a case and a connector which is attached to the case, wherein:
   the case has a main portion;
   the main portion has a top surface and a back surface in a first direction;
   the main portion has an opening;
   the opening pierces the main portion in the first direction;
   the connector is mateable along the first direction with a mating connector which is inserted through the opening;
   the connector comprises a housing and a waterproofing member;
   the housing has a bottom portion and a side portion;
   the bottom portion is positioned away from the back surface of the main portion in the first direction;
   the side portion extends from the bottom portion toward the back surface of the main portion in the first direction;
   the waterproofing member has an elastic property and is attached to the housing;
   the waterproofing member is sandwiched by the bottom portion and the back surface of the main portion in the first direction;
   the waterproofing member is sandwiched by the mating connector and the side portion in a second direction perpendicular to the first direction when the connector is mated with the mating connector;
   the waterproofing member has at least one first contact portion, at least one second contact portion, at least one third contact portion and at least one fourth contact portion;
   the first contact portion is pressed against and in contact with the bottom portion in the first direction by the elasticity of the waterproofing member;
   the second contact portion is pressed against and in contact with the back surface of the main portion in the first direction by the elasticity of the waterproofing member;
   the third contact portion is in contact with the side portion in the second direction;
   the third contact portion is pressed against the side portion in the second direction by the elasticity of the waterproofing member upon the mating of the connector with the mating connector;
   the fourth contact portion protrudes inward in the second direction beyond the opening; and
   the fourth contact portion is pressed against and in contact with the mating connector in the second direction by the elasticity of the waterproofing member upon the mating of the connector with the mating connector.

2. The electronic equipment as recited in claim 1, wherein the back surface of the main portion and the side portion of the housing are positioned away from each other in the first direction.

3. The electronic equipment as recited in claim 1, wherein:
   the waterproofing member has a recess portion;
   the waterproofing member has a first side and a second side which are opposite to each other in the second direction;
   the fourth contact portion is positioned at the first side of the waterproofing member;
   the recess portion is positioned at the second side of the waterproofing member; and
   the recess portion is positioned away from the side portion.

4. The electronic equipment as recited in claim 1, wherein:
   the at least one third contact portion includes two of the third contact portions;
   the third contact portions are positioned away from each other in the first direction;
   the connector is formed with a space between the waterproofing member and the side portion; and
   the space is positioned between the third contact portions in the first direction.

5. The electronic equipment as recited in claim 1, wherein the first contact portion is positioned closer to the fourth contact portion than to the side portion in the second direction.

6. The electronic equipment as recited in claim 1, wherein the second contact portion is positioned at a position same as a position of the first contact portion in the second direction.

7. The electronic equipment as recited in claim 1, wherein:
   the case further has a receiving portion;
   the receiving portion faces inward in the second direction;
   the waterproofing member further has a received portion;
   the received portion faces outward in the second direction;
   in the second direction, the received portion neighbors to the second contact portion and is provided at a location between the second contact portion and the side portion; and
   the received portion is pressed against the receiving portion upon the mating of the connector with the mating connector.

8. The electronic equipment as recited in claim 1, wherein:
   the waterproofing member has a first protrusion, a second protrusion, a third protrusion, a fourth protrusion and at least one fifth protrusion;
   each of the first protrusion and the second protrusion protrudes outward in the first direction;
   each of the third protrusion and the fourth protrusion protrudes outward in the first direction and extends outward in the second direction;
   the fifth protrusion protrudes inward in the second direction;
   the at least one first contact portion includes two of the first contact portions;
   one of the two first contact portions is provided on the first protrusion;
   a remaining one of the two first contact portions is provided on the third protrusion;
   the at least one second contact portion includes two of the second contact portions;
   one of the two second contact portions is provided on the second protrusion;
   a remaining one of the two second contact portions is provided on the fourth protrusion;
   the at least one third contact portion includes two of the third contact portions;
   one of the two third contact portions is provided on the third protrusion;
   a remaining one of the two third contact portions is provided on the fourth protrusion;
   the fourth contact portion is provided on the fifth protrusion;

the waterproofing member is formed with a first valley portion between the first protrusion and the third protrusion;

the waterproofing member is formed with a second valley portion between the second protrusion and the fourth protrusion; and the waterproofing member is formed with a recess portion between the third protrusion and the fourth protrusion.

9. The electronic equipment as recited in claim 8, wherein the fifth protrusion has an obtuse apex.

10. The electronic equipment as recited in claim 8, wherein:

the at least one fourth contact portion includes a plurality of the fourth contact portions;

the at least one fifth protrusion includes a plurality of the fifth protrusions; and the fourth contact portions are provided on the fifth protrusions, respectively.

11. The electronic equipment as recited in claim 8, wherein:

each of the first protrusion, the second protrusion, the third protrusion and the fourth protrusion has an end in the first direction; and in a state before the waterproofing member is attached to the housing, a distance from the end of the first protrusion to the end of the second protrusion in the first direction is greater than a distance from the end of the third protrusion to the end of the fourth protrusion in the first direction.

12. The electronic equipment as recited in claim 1, wherein, in a state before the waterproofing member is attached to the housing, the waterproofing member has a shape which is mirror-symmetrical with respect to a plane perpendicular to the first direction.

13. The electronic equipment as recited in claim 1, wherein:

the waterproofing member has a sandwiched portion; and the sandwiched portion is sandwiched by the case and the side portion in the first direction.

\* \* \* \* \*